United States Patent
Chung et al.

(10) Patent No.: US 11,955,578 B2
(45) Date of Patent: Apr. 9, 2024

(54) OPTOELECTRONIC APPARATUS AND METHOD OF MANUFACTURING THE SAME

(71) Applicants: Samsung Electronics Co., Ltd., Suwon-si (KR); UNIVERSITY-INDUSTRY COOPERATION GROUP OF KYUNG HEE UNIVERSITY, Yongin-si (KR)

(72) Inventors: Jong Won Chung, Hwaseong-si (KR); Sukho Choi, Yongin-si (KR); Sung Heo, Suwon-si (KR); Sung Kim, Yongin-si (KR); YongChul Kim, Seoul (KR)

(73) Assignees: SAMSUNG ELECTRONICS CO., LTD., Gyeonggi-Do (KR); UNIVERSITY-INDUSTRY COOPERATION GROUP OF KYUNG HEE UNIVERSITY, Gyeonggi-Do (KR)

( * ) Notice: Subject to any disclaimer, the term of this patent is extended or adjusted under 35 U.S.C. 154(b) by 617 days.

(21) Appl. No.: 17/037,859

(22) Filed: Sep. 30, 2020

(65) Prior Publication Data
US 2021/0143287 A1 May 13, 2021

(30) Foreign Application Priority Data
Nov. 13, 2019 (KR) .......................... 10-2019-0145396

(51) Int. Cl.
H01L 33/26 (2010.01)
H01L 33/00 (2010.01)

(52) U.S. Cl.
CPC ............ *H01L 33/005* (2013.01); *H01L 33/26* (2013.01)

(58) Field of Classification Search
CPC . H01L 31/12–173; H10K 65/00; H10K 85/50
See application file for complete search history.

(56) References Cited

U.S. PATENT DOCUMENTS

| | | |
|---|---|---|
| 10,079,356 B2 | 9/2018 | Etgar |
| 10,128,052 B1 | 11/2018 | Zang et al. |
| 2017/0346024 A1 | 11/2017 | Lee et al. |
| 2018/0134736 A1 | 5/2018 | Ma et al. |

(Continued)

FOREIGN PATENT DOCUMENTS

| | | |
|---|---|---|
| EP | 2936579 A1 | 10/2015 |
| KR | 101746296 B1 | 6/2017 |
| KR | 1020180074662 A | 7/2018 |

OTHER PUBLICATIONS

Abhishek Swarnkar et al., "Quantum dot-induced phase stabilization of a-CsPbI3 perovskite for high-efficiency photovoltaics," Solar Cells, Oct. 7, 2016, pp. 92-95, vol. 354, Issue 6308.

(Continued)

*Primary Examiner* — Daniel P Shook
(74) *Attorney, Agent, or Firm* — CANTOR COLBURN LLP

(57) ABSTRACT

Provided are an optoelectronic apparatus including an on-chip optoelectronic diode capable of receiving and emitting light, and a method of manufacturing the same.

20 Claims, 22 Drawing Sheets

(56) References Cited

U.S. PATENT DOCUMENTS

2019/0173025 A1* 6/2019 Uchida .................. H10K 30/82
2019/0348577 A1 11/2019 Pathak et al.

OTHER PUBLICATIONS

Dongqin Bi et al., "Efficient luminescent solar cells based on tailored mixed-cation perovskites," Research Article, Applied Optics, Jan. 1, 2016, pp. 1-7, DOI: 10.1126/sciadv. 1501170.
Hak-Beom Kim et al., "Peroptronic devices: perovskite-based light-emitting solar cells," Energy & Environmental Science, Aug. 10, 2017, pp. 1950-1957, vol. 10.
Kyung Taek Cho et al., "Selective growth of layered perovskites for stable and efficient photovoltaics," Energy & Environmental Science, Feb. 8, 2018, pp. 952-959, vol. 11.
Michael Saliba et al., "Incorporation of rubidium cations into perovskite solar cells improves photovoltaic performance," Solar Cells, Oct. 14, 2016, pp. 206-209, vol. 354, Issue 6309.
Zhi-Kuang Tan et al., "Bright light-emitting diodes based on organometal halide perovskite," Nature Nanotechnology, Aug. 3, 2014, pp. 1-6, DOI: 10.1038/NNANO.2014.149.
Sung Heo et al., "Dimensionally Engineered Perovskite Heterostructure for Photovoltaic and Optoelectronic Applications," Adv. Energy Mater. Oct. 30, 2019, pp. 1-8, vol. 9, No. 1902470.

\* cited by examiner

OPTOELECTRONIC APPARATUS AND METHOD OF MANUFACTURING THE SAME

CROSS-REFERENCE TO RELATED APPLICATION

This application claims priority to and the benefit of Korean Patent Application No. 10-2019-0145396, filed on Nov. 13, 2019, in the Korean Intellectual Property Office, and all the benefits accruing therefrom under 35 U.S.C. § 119, the content of which is incorporated herein in its entirety by reference.

BACKGROUND

1. Field

The present disclosure relates to an optoelectronic apparatus and a method of manufacturing the same.

2. Description of Related Art

Optoelectronic diodes are devices capable of interchangeably converting electrical energy and optical energy.

Optoelectronic diodes may be roughly classified into two types as follows according to operational principles.

One type is a light-receiving diode in which excitons generated by external light energy are divided into electrons and holes, which are then transferred to different electrodes to generate electrical energy. The other type is a light-emitting diode in which excitons generated by the electrical energy applied to two or more electrodes change to the ground state to generate electrical energy.

Usually, an optoelectronic diode includes an anode, a cathode, and a photoelectric conversion layer interposed between the anode and the cathode. To improve the efficiency and stability of the optoelectronic diode, an additional layer for injecting or transporting electrons or holes may be further included.

SUMMARY

Provided are a novel optoelectronic apparatus and a method of manufacturing the same, and more particularly, an optoelectronic apparatus including a photoelectric conversion layer capable of both receiving and emitting light, and a method of manufacturing the electronic apparatus.

Additional aspects will be set forth in part in the description which follows and, in part, will be apparent from the description, or may be learned by practice of the presented embodiments of the disclosure.

According to an aspect of the present disclosure, there is provided an optoelectronic apparatus including: an optoelectronic diode including a first electrode, a second electrode, and a photoelectric conversion layer interposed between the first electrode and the second electrode; a first driving part; and a second driving part, wherein each of the first driving part and the second driving part is electrically connected to the optoelectronic diode, the optoelectronic diode is driven by the first driving part in a light-receiving mode, the optoelectronic diode is driven by the second driving part in a light-emitting mode, and wherein the photoelectric conversion layer includes a first layer including a three-dimensional perovskite, and a second layer including a two-dimensional perovskite.

In an embodiment, the first driving part may collect power generated between the first electrode and the second electrode, and the second driving part may apply power between the first electrode and the second electrode.

In an embodiment, the first driving part and the second driving part may be electrically connected to allow power collected by the first driving part to be supplied to the second driving part.

In an embodiment, the optoelectronic apparatus may further include a sensor part, wherein the sensor part may sense external light to determine whether the optoelectronic diode operates in the light-receiving mode or the light-emitting mode.

In an embodiment, the first layer including the three-dimensional perovskite and the second layer including the two-dimensional perovskite may directly contact each other.

In an embodiment, light may be emitted at an interface between the first layer including the three-dimensional perovskite and the second layer including the two-dimensional perovskite in the light-emitting mode.

In an embodiment, a band gap of the two-dimensional perovskite may be different from a band gap of the three-dimensional perovskite.

In an embodiment, a band gap of the two-dimensional perovskite may be greater than a band gap of the three-dimensional perovskite.

In an embodiment, a difference in band gap between the two-dimensional perovskite and the three-dimensional perovskite may be about 0.01 eV to about 1.0 eV.

In an embodiment, the three-dimensional perovskite may be represented by Formula 1, and the two-dimensional perovskite may be represented by Formula 2:

$$[A^1][B^1][X^1]_3 \quad \text{Formula 1}$$

$$[A^2]_2[A^3]_{n-1}[B^2]_n[X^2]_{n+1} \quad \text{Formula 2}$$

wherein, in Formula 1, $A^1$ may be $R_{11}R_{12}R_{13}C$, $R_{14}R_{15}R_{16}R_{17}N$, $R_{18}R_{19}N=C(R_{20})-NR_{21}R_{22}$, Li, Na, K, Rb, Cs, Fr, or a combination thereof, $A^2$ and $A^3$ may each independently be $R_{31}R_{32}R_{33}C$, $R_{34}R_{35}R_{36}R_{37}N$, $R_{38}R_{39}N=C(R_{40})-NR_{41}R_{42}$, Li, Na, K, Rb, Cs, Fr, or a combination thereof, wherein $R_{11}$ to $R_{22}$ may each independently be hydrogen, deuterium, $-N(Q_{11})(Q_{12})$, a $C_1$-$C_3$ alkyl group, a $C_2$-$C_3$ alkenyl group, a $C_2$-$C_3$ alkynyl group, a $C_1$-$C_3$ alkoxy group, or a combination thereof, wherein $Q_{11}$ and $Q_{12}$ may each independently be hydrogen, deuterium, a $C_1$-$C_3$ alkyl group, a $C_2$-$C_3$ alkenyl group, a $C_2$-$C_3$ alkynyl group, a $C_1$-$C_3$ alkoxy group, or a combination thereof;

wherein $R_{31}$ to $R_{42}$ may each independently be hydrogen, deuterium, $-N(Q_{21})(Q_{22})$, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{20}$ aryl group, a substituted or unsubstituted $C_7$-$C_{20}$ aralkyl group, or a combination thereof, wherein at least one of $R_{31}$ to $R_{33}$, at least one of $R_{34}$ to $R_{37}$, and at least one of $R_{38}$ to $R_{42}$ may each independently be substituted or unsubstituted $C_4$-$C_{10}$ alkyl group, a substituted or unsubstituted $C_4$-$C_{10}$ alkenyl group, a substituted or unsubstituted $C_4$-$C_{10}$ alkynyl group, a substituted or unsubstituted $C_4$-$C_{10}$ alkoxy group, a substituted or unsubstituted $C_6$-$C_{20}$ aryl group, a substituted or unsubstituted $C_7$-$C_{20}$ aralkyl group, or a combination thereof;

wherein $Q_{21}$ and $Q_{22}$ may each independently be hydrogen, deuterium, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{20}$ aryl group, a substituted or unsubstituted $C_7$-$C_{20}$ aralkyl group, or a combination thereof;

$B^1$ and $B^2$ may each independently be Pb, Sn, Bi, Sb, Cu, Ag, Au, La, Ce, Pr, Nd, Pm, Sm, Eu, Gd, Tb, Dy, Ho, Er, Tm, Yb, Lu, Be, Mg, Ca, Sr, Ba, Ra, or a combination thereof;

$X^1$ and $X^2$ may each independently be F, Cl, Br, I, or a combination thereof; and n may be an integer of 1 or greater.

In an embodiment, $A^1$ may be $NH_4$, $CH_3NH_3$, $C_2H_5NH_3$, $(CH_3)_2NH_2$, $CH(NH_2)_2$, Li, Na, K, Rb, Cs, Fr, or a combination thereof; $A^2$ and $A^3$ may each independently be anilinium, phenylmethyl ammonium, phenylethyl ammonium, a $C_4$-$C_{10}$ alkyl ammonium, or a combination thereof; $B^1$ and $B^2$ may each independently be Pb, Sn, Bi, Sb, Cu, Ag, Au, or a combination thereof; and $X^1$ and $X^2$ may each independently be Cl, Br, I, or a combination thereof.

In an embodiment, $A^1$ may be $CH_3NH_3$, $CH(NH_2)_2$, Cs, or a combination thereof; $A^2$ and $A^3$ may each independently be phenylethyl ammonium; $B^1$ and $B^2$ may each independently be Pb; $X^1$ and $X^2$ may each independently be Br, I, or a combination thereof; and n may be 1.

In an embodiment, the three-dimensional perovskite may be represented by Formula 1-1, and the two-dimensional perovskite may be represented by Formula 2-1:

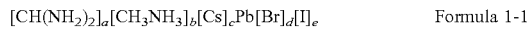

$$[CH(NH_2)_2]_a[CH_3NH_3]_b[Cs]_cPb[Br]_d[I]_e \qquad \text{Formula 1-1}$$

$$PEA_2PbI_4 \qquad \text{Formula 2-1}$$

wherein, in Formulae 1-1 and 2-1, a, b, and c may each independently be a real number greater than 0 to less than 1, and (a+b+c)=1;

d and e may each independently be a real number greater than 0 to less than 3, and (d+e)=3; and PEA is phenylethyl ammonium.

In an embodiment, at least one of the first electrode or the second electrode may have a transmittance of about 75% to 100% with respect to light having a wavelength ranging from about 10 nm to about 1 mm.

In an embodiment, the optoelectronic apparatus may further include a first charge transport region disposed between the first electrode and the photoelectric conversion layer, and/or a second charge transport region disposed between the photoelectric conversion layer and the second electrode.

In an embodiment, the first charge transport region may include a metal oxide.

In an embodiment, the first charge transport region may include $TiO_2$, ZnO, $SrTiO_3$, $WO_3$, or a combination thereof.

In an embodiment, the second charge transport region may include a hole-transporting organic small molecule, a hole-transporting organic polymer compound, or a combination thereof.

In an embodiment, the second charge transport region may include 2,2,7,7'-tetrakis-(N,N-di-p-methoxyphenyl-amine)-9,9'-spirobifluoren (spiro-MeOTAD), poly(3-hexyl-thiophene), 4-tert-butylpyridine, lithium bis(trifluoromethane)sulfonimidate (Li-TFSI), or a combination thereof.

According to an aspect, there is provided a method of manufacturing an optoelectronic apparatus, the method including: providing an optoelectronic diode comprising a first electrode, a second electrode, disposing a three-dimensional perovskite solution onto the first electrode to form a first layer; disposing a two-dimensional perovskite solution onto the first layer to form a second layer; and providing a first driving part and a second driving part which are electrically connected to the optoelectronic diode, wherein the first layer and the second layer form a photoelectric conversion layer between the first electrode and the second electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
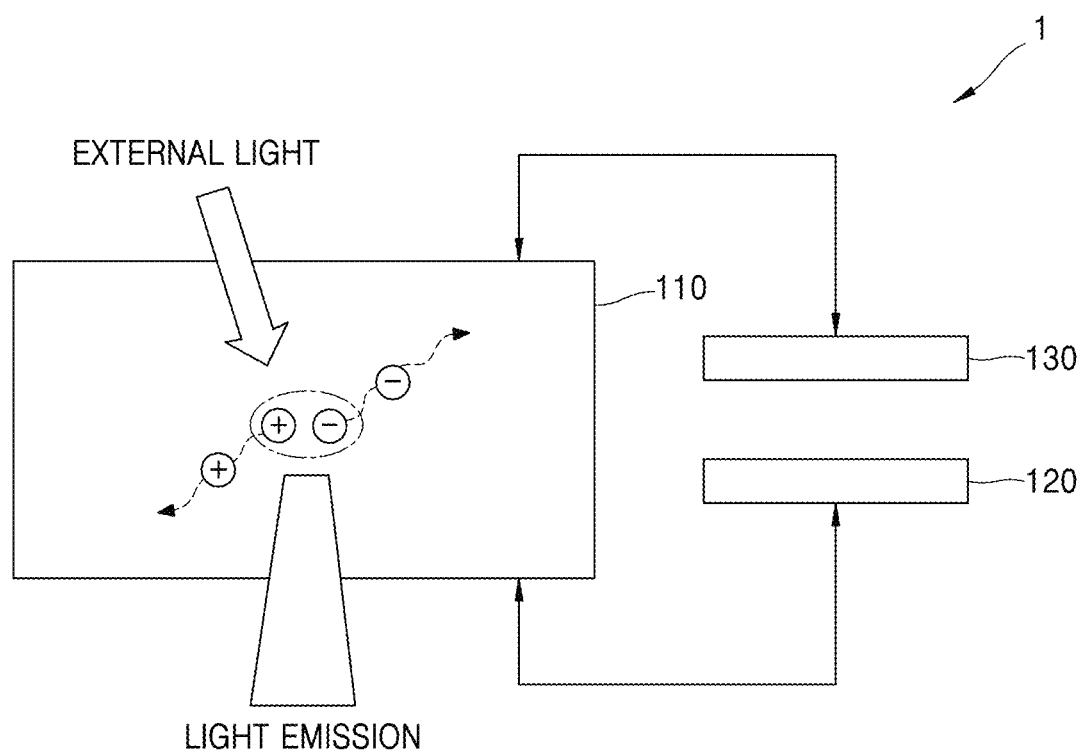
FIG. 1 is a schematic diagram illustrating a structure of an optoelectronic apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings. Effects, features, and a method of achieving the present disclosure will be obvious by referring to example embodiments of the present disclosure with reference to the attached drawings. The present disclosure may, however, be embodied in many different forms and should not be construed as being limited to the embodiments set forth herein.

General and widely used terms have been employed herein, in consideration of functions provided in the present disclosure, and may vary according to an intention of one of ordinary skill in the art, a precedent, or emergence of new technologies. Additionally, in some cases, an applicant may arbitrarily select specific terms. Then, the applicant will provide the meaning of the terms in the description of the present disclosure. Accordingly, it will be understood that the terms used herein should be interpreted as having a meaning that is consistent with their meaning in the context of the relevant art and will not be interpreted in an idealized or overly formal sense unless expressly so defined herein.

As used herein, the terms such as "including", "having", or the like are intended to indicate the existence of the features or elements disclosed in the specification, and are not intended to preclude the possibility that one or more other features or elements may exist or may be added.

In the accompanying drawings, like reference numerals refer to like elements throughout and the sizes of elements are exaggerated or reduced for clarity and ease of description.

It will also be understood that when an element such as a layer, a film, a region or a component is referred to as being "on" another layer or element, it can be directly on the other layer or element, or intervening layers, regions, or components may also be present. When an element is referred to as being "directly or immediately on," this means that any intervening element is not present.

As used herein, the singular forms "a," "an," and "the" are intended to include the plural forms as well, unless the context clearly indicates otherwise.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% or 1% of the stated value.

As used herein, the term "perovskite" refers to a compound with first cations at a location (0,0,0), second cations at a location (1/2,1/2,1/2), and anions at a location (1/2,1/2,0). The term "perovskite" used herein may be construed as including not only perovskite having an ideal symmetrical structure of $CaTiO_3$, but also perovskite having a twisted structure with lower symmetry.

As used herein, the "three-dimensional perovskite" refers to a perovskite having a three-dimensional crystal structure.

As used herein, the "two-dimensional perovskite" refers to a perovskite having, not three-dimensional structure, a two-dimensional or quasi-two-dimensional crystal structure.

As used herein, the term "maximum emission wavelength" refers to a wavelength at the maximum emission intensity of a photoluminescence (PL) spectrum obtained for a prepared solution or film sample including a compound.

Optoelectronic Apparatus

Figure 2:
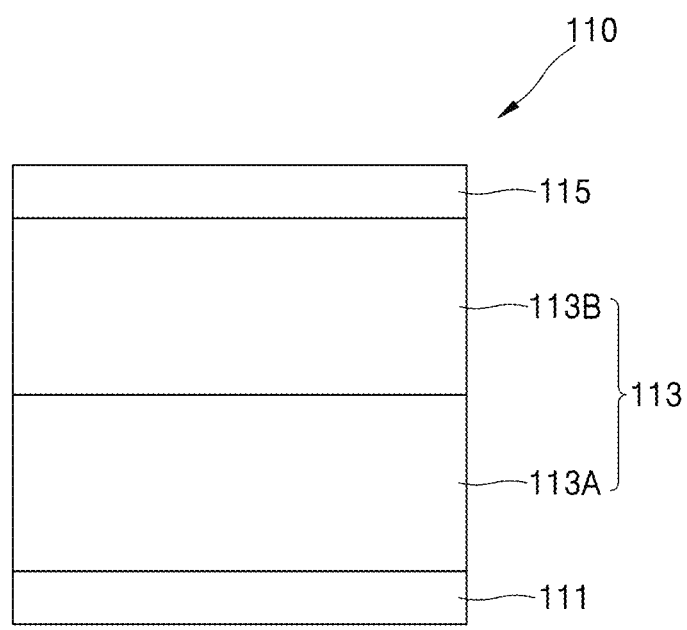
FIG. 2 is a schematic cross-sectional view of an optoelectronic diode which is part of the optoelectronic apparatus according to an embodiment.

A schematic structure of an optoelectronic device according to an embodiment will be described with reference to FIGS. 1 and 2. FIG. 1 is a schematic diagram illustrating a structure of an optoelectronic apparatus 1 according to an embodiment. FIG. 2 is a schematic cross-sectional view of an optoelectronic diode 110, which is a part of the optoelectronic apparatus 1.

In an embodiment, the optoelectronic apparatus 1 may include an optoelectronic diode 110, a first driving part 120, and a second driving part 130. The first driving part 120 and the second driving part 130 are electrically connected to the optoelectronic diode 110. The optoelectronic diode 110 is driven by the first driving part 120 in a light-receiving mode, and is driven by the second driving part 130 in a light-emitting mode. The optoelectronic diode 110 may include: a first electrode 111; a second electrode 115; and a photoelectric conversion layer 113 interposed between the first electrode 111 and the second electrode 115. The photoelectric conversion layer 113 may include a first layer 113A including a three-dimensional perovskite and a second layer 113B including a two-dimensional perovskite.

In the optoelectronic apparatus 1, a single photoelectric conversion layer 113 may both receive light and emit light. This structure is clearly distinct from an optoelectronic apparatus in which a light-emitting diode and a solar cell are separately formed to respectively have separate electrodes, which are connected to each other.

The optoelectronic apparatus 1 may be improved in both light-receiving efficiency and light-emitting efficiency, and thus is clearly distinguished from optoelectronic devices in which the light-receiving efficiency and the light-emitting efficiency have a trade-off relationship.

In particular, the optoelectronic apparatus 1 may have a power conversion efficiency of about 17% or greater, about 20% or greater, or about 23% or greater.

In particular, the optoelectronic apparatus 1 may have an external quantum efficiency of about 3% or greater, or about 4% or greater.

The first driving part 120 may collect power generated between the first electrode 111 and the second electrode 115, and the second driving part 130 may apply power between the first electrode 111 and the second electrode 115.

In an embodiment, the first driving part 120 and the second driving part 130 may be electrically connected to allow power collected by the first driving part 120 to be supplied to the second driving part 130.

The optoelectronic apparatus may further include a sensor part (not shown), wherein the sensor part may sense external light to determine whether the optoelectronic diode operates in the light-receiving mode or the light-emitting mode.

In particular, when the sensor part detects the presence of external light, the sensor part may transmit a signal to the first driving part 120 to enable operation of the optoelectronic diode 110 in the light-receiving mode. In other cases, the sensor part may transmit a signal to the second driving part 130 to enable operation of the optoelectronic diode 110 in the light-emitting mode.

Alternatively, when the presence of external light is not sensed by the sensor part, turn on/off of the second driving part 130 may be determined by the operation of the auxiliary circuit.

Although not illustrated in FIG. 2, a substrate may be additionally disposed on a lower surface of the first electrode 111 (the side opposite to the photoelectric conversion layer 113) and/or an upper surface of the second electrode 115 (the side opposite to the photoelectric conversion layer 113. The substrate may be a substrate used in common light-emitting devices. The substrate may be a glass substrate or a transparent plastic substrate having excellent mechanical strength, thermal stability, transparency, surface smoothness, ease of handling, and water resistance.

In the light-emitting mode, the first electrode 111 may be an anode to which a positive (+) voltage is applied, and the second electrode 115 may be a cathode to which a negative (−) voltage is applied. On the contrary, the first electrode 111 may be a cathode, and the second electrode 115 may be an anode. As a matter of convenience, embodiments will be descried with the assumption that the first electrode 111 is an anode, and the second electrode 115 is a cathode.

In an embodiment, the first electrode 111 and/or the second electrode 115 may have a transmittance of about 75% or greater with respect to light having a wavelength ranging from about 10 nanometers (nm) to 1 millimeter (mm). For example, the first electrode 111 and/or the second electrode 115 may have a transmittance of about 80% or greater, about 85% or greater, about 90% or greater, about 95% or greater, or about 97% or greater, and the maximum transmittance may be up to 100%, with respect to light having a wavelength ranging from about 10 nm to about 1 mm. However, embodiments are not limited thereto.

In particular, the first electrode 111 may be formed by providing a material for forming the first electrode onto a surface of the substrate by deposition or sputtering. The first electrode 111 may have a single layer structure or a multi-layer structure including two or more layers.

The first electrode 111 may include fluorine-doped tin oxide (FTO), indium tin oxide (ITO), indium zinc oxide (IZO), indium aluminum oxide (AZO), indium oxide, tin oxide ($SnO_2$), zinc oxide (ZnO), gallium oxide, aluminum oxide, magnesium oxide, or a combination thereof. In other embodiments, the material for forming the first electrode 111 may include magnesium (Mg), aluminum (Al), aluminum-lithium (Al—Li), calcium (Ca), magnesium-indium (Mg—In), magnesium-silver (Mg—Ag), or a combination thereof.

The second electrode 115 may be provided to face the first electrode 111. The above-detailed description of the first electrode 111 applies to the second electrode 115.

Figure 3:
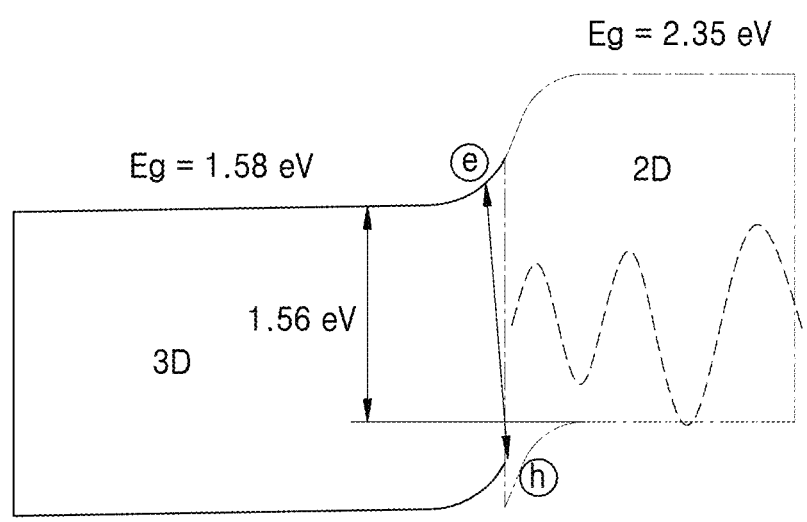
FIG. 3 is a schematic view of a band model of a photoelectric conversion layer according to an embodiment.

Hereinafter, the photoelectric conversion layer 113 of the optoelectronic diode 110 will be described in detail with reference to FIG. 3. FIG. 3 is a schematic view of a band model of the photoelectric conversion layer 113 according to an embodiment.

In the photoelectric conversion layer 113, the first layer 113A and the second layer 113B may directly contact each other. In particular, the photoelectric conversion layer 113 may have a hetero-junction structure of the first layer 113A and the second layer 113B.

In the light-emitting mode, light may be emitted at the interface between the first layer 113A and the second layer 113B. The light may be near infrared light, for example, light having a wavelength from about 720 nm or greater to about 3000 nm or less, from about 720 nm or greater to about 2500 nm or less, from about 720 nm or greater to about 1000 nm or less, or from about 720 nm or greater to about 820 nm or less. However, embodiments are not limited thereto. At the interface between the first layer 113A and the second layer 113B, the densities of electrons and holes may be high, and the recombination rate thereof may high, and thus the optoelectronic apparatus may have improved emission efficiency.

As shown in FIG. 3, the two-dimensional perovskite and the three-dimensional perovskite may have different band gaps. A band gap of the two-dimensional perovskite may be greater than a band gap of the three-dimensional perovskite. More specifically, a difference between the band gap of the two-dimensional perovskite and the band gap of the three-dimensional perovskite may be, for example, about 0.01 eV to about 1.0 eV.

Due to this, the valance band at the interface between the first layer 113A and the second layer 113B may be discontinuous. This structure may serve as quantum wells for holes. In general, in a perovskite layer, holes have higher mobility and longer diffusion length as compared with electrons. Accordingly, when the densities of electrons and holes at the interface of the first layer 113A and the second layer 113B are increased, the density of holes at the quantum wells is also increased, thereby generating electroluminescence (EL).

Through deep-level transient spectroscopy (DLTS) spectrum analysis, it can be confirmed that the defect density is relatively lower at the hetero-junction interface of two-dimensional perovskite and three-dimensional perovskite than at each of single layer of two-dimensional perovskite and three-dimensional perovskite. Such a relatively low defect density may also facilitate electroluminescence (EL).

On the other hand, if no hetero-junction interface exists, there is nearly no probability of any occurrence of radiative recombination of electrons and holes, which normally occurs due to the transfer or density increase of carriers (electrons and holes). In other words, the optoelectronic apparatus according to an embodiment may have improved emission efficiency, due to a high density of carriers (electrons and holes) at the hetero-junction interface and improved recombination rate of carriers.

In an embodiment, the three-dimensional perovskite may be represented by Formula 1:

$$[A^1][B^1][X^1]_3 \qquad \text{Formula 1}$$

In Formula 1, $A^1$ may be $R_{11}R_{12}R_{13}C$, $R_{14}R_{15}R_{16}R_{17}N$, $R_{18}R_{19}N{=}C(R_{20}){-}NR_{21}R_{22}$, Li, Na, K, Rb, Cs, Fr, or a combination thereof, $R_{11}$ to $R_{22}$ may each independently be hydrogen, deuterium, $-N(Q_{11})(Q_{12})$, a $C_1$-$C_3$ alkyl group, a $C_2$-$C_3$ alkenyl group, a $C_2$-$C_3$ alkynyl group, a $C_1$-$C_3$ alkoxy group, or a combination thereof, $Q_{11}$ and $Q_{12}$ may each independently be hydrogen, deuterium, a $C_1$-$C_3$ alkyl group, a $C_2$-$C_3$ alkenyl group, a $C_2$-$C_3$ alkynyl group, a $C_1$-$C_3$ alkoxy group, or a combination thereof;

$B^1$ may be Pb, Sn, Bi, Sb, Cu, Ag, Au, La, Ce, Pr, Nd, Pm, Sm, Eu, Gd, Tb, Dy, Ho, Er, Tm, Yb, Lu, Be, Mg, Ca, Sr, Ba, Ra, or a combination thereof; and $X^1$ may be F, Cl, Br, I, or a combination thereof.

For example, in Formula 1, $A^1$ may be $NH_4$, $CH_3NH_3$, $C_2H_5NH_3$, $(CH_3)_2NH_2$, $CH(NH_2)_2$, Li, Na, K, Rb, Cs, Fr, or a combination thereof.

In an embodiment, in Formula 1, $A^1$ may be $CH_3NH_3$, $CH(NH_2)_2$, Cs, or a combination thereof.

For example, in Formula 1, $B^1$ may be Pb, Sn, Bi, Sb, Cu, Ag, Au, or a combination thereof.

In an embodiment, in Formula 1, $B^1$ may be Pb.

For example, in Formula 1, $X^1$ may be Cl, Br, I, or a combination thereof.

In an embodiment, in Formula 1, $X^1$ may be Br, I, or a combination thereof.

In an embodiment, the three-dimensional perovskite may be represented by Formula 1-1.

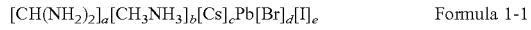
$[CH(NH_2)_2]_a[CH_3NH_3]_b[Cs]_cPb[Br]_d[I]_e$  Formula 1-1

In Formula 1-1, a, b, and c may each independently be a real number greater than 0 to less than 1, and the sum of a, b and c may be equal to 1; and d and e may each independently be a real number greater than 0 to less than 3, and the sum of d and e is equal to 3.

In an embodiment, the two-dimensional perovskite may be represented by Formula 2.

$[A^2]_2[A^3]_{n-1}[B^2]_n[X^2]_{3n+1}$  Formula 2

$A^2$ and $A^3$ may each independently be $R_{31}R_{32}R_{33}C$, $R_{34}R_{35}R_{36}R_{37}N$, $R_{38}R_{39}N$$C(R_{40})$—$NR_{41}R_{42}$, Li, Na, K, Rb, Cs, Fr, or a combination thereof, wherein $R_{31}$ to $R_{42}$ may each independently be hydrogen, deuterium, —$N(Q_{21})(Q_{22})$, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{20}$ aryl group, a substituted or unsubstituted $C_7$-$C_{20}$ aralkyl group, or a combination thereof, wherein at least one selected from $R_{31}$ to $R_{33}$, at least one selected from $R_{34}$ to $R_{37}$, and at least one selected from $R_{38}$ to $R_{42}$ may each independently be a substituted or unsubstituted $C_4$-$C_{10}$ alkyl group, a substituted or unsubstituted substituted $C_4$-$C_{10}$ alkenyl group, a substituted or unsubstituted $C_4$-$C_{10}$ alkynyl group, a substituted or unsubstituted $C_4$-$C_{10}$ alkoxy group, a substituted or unsubstituted $C_6$-$C_{20}$ aryl group, a substituted or unsubstituted $C_7$-$C_{20}$ aralkyl group, or a combination thereof;

wherein $Q_{21}$ and $Q_{22}$ may each independently be hydrogen, deuterium, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{20}$ aryl group, a substituted or unsubstituted $C_7$-$C_{20}$ aralkyl group, or a combination thereof;

$B^2$ may be Pb, Sn, Bi, Sb, Cu, Ag, Au, La, Ce, Pr, Nd, Pm, Sm, Eu, Gd, Tb, Dy, Ho, Er, Tm, Yb, Lu, Be, Mg, Ca, Sr, Ba, Ra, or a combination thereof;

$X^2$ may be F, Cl, Br, I, or a combination thereof; and n may be an integer of 1 or greater.

For example, in Formula 2, $A^2$ and $A^3$ may each independently be anilinium, phenylmethyl ammonium, phenylethyl ammonium, a $C_4$-$C_{10}$ alkyl ammonium, or a combination thereof.

In an embodiment, in Formula 2, $A^2$ and $A^3$ may each be phenylethyl ammonium.

For example, in Formula 2, $B^1$ and $B^2$ may each independently Pb, Sn, Bi, Sb, Cu, Ag, Au, or a combination thereof.

In an embodiment, in Formula 2, $B^1$ and $B^2$ may each be Pb.

For example, in Formula 2, $X^1$ and $X^2$ may each independently be Cl, Br, I, or a combination thereof.

In an embodiment, in Formula 2, $X^1$ and $X^2$ may each independently be Br, I, or a combination thereof.

For example, in Formula 2, n may be 1.

In an example, the two-dimensional perovskite may be represented by Formula 2-1.

$PEA_2PbI_4$  Formula 2-1

In Formula 2-1, PEA is phenylethyl ammonium.

Although not illustrated, the optoelectronic apparatus according to an embodiment may further include a first charge transport region interposed between the first electrode 111 and the photoelectric conversion layer 113, and/or a second charge transport region disposed between the photoelectric conversion layer 113 and the second electrode 115.

The first charge transport region and the second charge transport region may each serve as an electron transport region or as a hole transport region according to the light-receiving mode or the light-emitting mode.

The first charge transport region may include a metal oxide. For example, the first charge transport region may include $TiO_2$, ZnO, $SrTiO_3$, $WO_3$, or a combination thereof. In an embodiment, the first charge transport region may include a fullerene or a fullerene derivative depending on circumstances.

The second charge transport region may include a hole-transporting organic small molecule, a hole-transporting organic polymer compound, or a combination thereof. For example, the second charge transport region may include 2,2,7,7'-tetrakis-(N,N-di-p-methoxyphenyl-amine)-9,9'-spirobifluoren (spiro-MeOTAD), poly(3-hexylthiophene), 4-tert-butylpyridine, lithium bis(trifluoromethane)sulfonimidate (Li-TFSI, also known as lithium bis(trifluoromethanesulfonyl)imide), or a combination thereof.

The first charge transport region and/or the second charge transport region may each comprise a plurality of layers, and may be varied in different ways according to circumstances.

Method of Manufacturing Optoelectronic Apparatus

According to an embodiment, a method of manufacturing an optoelectronic apparatus may include: providing an optoelectronic diode including a first electrode, a second electrode, and a photoelectric conversion layer interposed between the first electrode and the second electrode; and providing a first driving part and a second driving part which are electrically connected to the optoelectronic diode, wherein the photoelectric conversion layer is provided by providing a three-dimensional perovskite solution onto the first electrode to form a first layer and providing a two-dimensional perovskite solution onto the first layer to form a second layer.

The three-dimensional perovskite solution and the two-dimensional perovskite solution may each be provided by spin coating. When these solutions are provided by spin coating, the spin coating conditions may be selected to be, for example, a coating speed of about 300 rpm to about 4000 rpm and a temperature range of about 80° C. to about 200° C., in consideration of the composition of the solution. For example, the coating speed may be controlled to be different in multiple sections. For example, the coating speed may be maintained at about 300 rpm to about 2000 rpm in a first section and at about 2000 rpm to about 4000 rpm in a second section.

The solution may be provided onto a substrate using any of various suitable methods.

The method of manufacturing an optoelectronic apparatus may further include forming a first charge transport region on the first electrode; and/or forming a second charge transport region on the photoelectric conversion layer.

Each layer of the optoelectronic apparatus may be formed using any of a variety of methods such as vacuum deposition, spin coating, casting, or Langmuir-Blodgett (LB) deposition.

Although the embodiments of the optoelectronic apparatus are described above with reference to FIGS. 1 to 3, embodiments are not limited thereto.

The optoelectronic apparatus according an embodiment may constitute part or whole of a portable information device, a small display device having a small panel size such as a digital camera, a camcorder or a portable game device, a medium-large-size display device such as a mobile phone, a head mount display, an electronic book, a personal computer or a television, a vehicle, or a biosensor.

For example, the optoelectronic apparatus according to an embodiment may constitute part or whole of a self-sustainable display, a self-sustainable lighting device, or the like.

An embodiment of the optoelectronic apparatus and the method of manufacturing the same will now be described in detail with reference to the following examples. However, these examples are only for illustrative purposes and are not intended to limit the scope of the embodiments of the present disclosure.

EXAMPLES

Materials

Formamidinium Iodide (FAI), methylammonium bromide (MABr), tris(2-(1H-pyrazol-1-yl)-4-tert-butylpyridine)cobalt(III) tri[bis(trifluoromethane)sulfonimide] (Co[t-BuPyPz]3[TFSI]3 (FK209)), $PbI_2$, $PbBr_2$, and CsI were purchased and used.

Phenylammonium iodide (PEAI) was synthesized according to the following method.

10 milliliters (mL) of phenylethylamine was diluted with 20 mL of anhydrous ethanol, and then cooled in an ice bath. While being stirred vigorously, 20 mL of hydrogen iodide (55 wt % aqueous solution) was dropwise added thereto and stirred for 20 minutes. Next, the colorless precipitate was filtered and washed twice with diethyl ether, and then dissolved again in methanol. To obtain pure white crystals, recrystallization was carried out three times, and then drying was carried out.

Example (2DI3D)

Two-Dimensional/Three-Dimensional Hybrid Perovskite Iodide

Fluorine-doped tin oxide (FTO) glass substrate (Nippon sheet glass) was washed with a cleaning agent, acetone, and then ethanol. $TiO_2$ was formed on the FTO glass substrate through spray pyrolysis at 450° C. To dope lithium (Li) onto the $TiO_2$, 0.1M of lithium bis(trifluoromethane)sulfonimidate (Li-TFSI) in acetonitrile solution was spin-coated at 3,000 rpm for 10 seconds, and then finally sintered at 500° C. for 30 minutes. FAI (1.1M), $PbI_2$ (1.15M), MABr (0.2M), and $PbBr_2$ (0.2M) were mixed in a mixed solvent of DMF and DMSO in a ratio of 4:1 (by volume) to prepare a lead-rich $(FAPbI_3)_{0.85}(MAPbBr_3)_{0.15}$ precursor solution. A 1.15M of $CsPbI_3$ precursor solution (in a mixed solvent of DMF and DMSO in equal volume) was prepared. The $(FAPbI3)_{0.85}(MAPbBr_3)_{0.15}$ precursor solution and the $CsPbO_3$ precursor solution were mixed in a ratio of 10 vol. %. The mixed solution was spin-coated in a nitrogen glove box at 1000 rpm for 10 seconds and then 4,000 rpm for 30 seconds. In this second stage, 100 μl of anhydrous trifluorotoluene was poured 15 seconds before completion of the spin coating. The resulting film was thermally treated at 100° C. for 60 minutes to thereby form a three-dimensional perovskite (hereinafter, referred to also as "3D"). To form a two-dimensional perovskite (hereinafter, referred to also as "2D"), the 3D perovskite was treated with a phenylethyl ammonium iodide (PEAI) isopropanol solution. In particular, 10000 μl of the PEAI solution (15 mg ml$^{-1}$) was spin-coated on the 3D at 4,000 rpm in a similar manner as described above. Then, a 70-mM spiro-MeOTAD solution was spin-coated at 4000 rpm for 20 seconds. The 70-mM spiro-MeOTAD solution was prepared by dissolving, in chlorobenzene, 4-tert-butylpyridine (TBP), Li-TFSI dissolved in acetonitrile, and $Co[t-BuPyPz]_3[TFSI]_3$ (FK209) dissolved in acetonitrile, to be in a molar ratio of Spiro:FK209:Li-TFSI:TBP of 1:0.03:0.5:3.3. Next, a gold electrode having a thickness of 70 nm was formed thereon by thermal deposition.

Comparative Example 1

Two-Dimensional (2D) Perovskite Diode

A 2D diode was manufactured in the same manner as in the Example (2DI3D), except that 3D were not formed.

In particular, fluorine-doped tin oxide (FTO) glass substrate (Nippon sheet glass) was washed with a cleaning agent, acetone, and then ethanol. $TiO_2$ was formed on the FTO glass substrate through spray pyrolysis at 450° C. To dope lithium (Li) onto the $TiO_2$, 0.1M of lithium bis(trifluoromethane)sulfonimidate (Li-TFSI) in acetonitrile solution was spin-coated at 3,000 rpm for 10 seconds, and then finally sintered at 500° C. for 30 minutes. FAI (1.1M), $PbI_2$ (1.15M), MABr (0.2M), and $PbBr_2$ (0.2M) were mixed in a mixed solvent of DMF and DMSO in a ratio of 4:1 (by volume) to prepare a lead-rich $(FAPbI_3)_{0.85}(MAPbBr_3)_{0.15}$ precursor solution. A 1.15M of $CsPbI_3$ precursor solution (in a mixed solvent of DMF and DMSO in equal volume was prepared. The $(FAPbI3)_{0.85}(MAPbBr_3)_{0.15}$ precursor solution and the $CsPbI_3$ precursor solution were mixed in a ratio of 10 vol. %. The mixed solution was spin-coated in a nitrogen glove box at 1000 rpm for 10 seconds and then 4,000 rpm for 30 seconds. To form a two-dimensional perovskite (referred to also as "2D"), the resulting product was treated with a phenylethyl ammonium iodide (PEAI) isopropanol solution. In particular, 10000 μl of the PEAI solution (15 mg ml$^{-1}$) was spin-coated on the 3D at 4,000 rpm in a similar manner as described above. Then, a 70-mM spiro-MeOTAD solution was spin-coated at 4000 rpm for 20 seconds. The 70-mM spiro-MeOTAD solution was prepared by dissolving, in chlorobenzene, 4-tert-butylpyridine (TBP), Li-TFSI dissolved in acetonitrile, and $Co[t-BuPyPz]_3[TFSI]_3$ (FK209) dissolved in acetonitrile, to be in a molar ratio of Spiro:FK209:Li-TFSI:TBP of 1:0.03:0.5:3.3. Next, a gold electrode having a thickness of 70 nm was formed thereon by thermal deposition.

Comparative Example 2

Three-Dimensional Perovskite (3D) Diode

A 3D diode was manufactured in the same manner as in Example (2DI3D), except that the 2D was not formed.

Fluorine-doped tin oxide (FTO) glass substrate (Nippon sheet glass) was washed with a cleaning agent, acetone, and then ethanol. $TiO_2$ was formed on the FTO glass substrate through spray pyrolysis at 450° C. To dope lithium (Li) onto the $TiO_2$, 0.1M of lithium bis(trifluoromethane)sulfonimidate (Li-TFSI) in acetonitrile solution was spin-coated at 3,000 rpm for 10 seconds, and then finally sintered at 500° C. for 30 minutes. FAI (1.1M), $PbI_2$ (1.15M), MABr (0.2M), and $PbBr_2$ (0.2M) were mixed in a mixed solvent of DMF and DMSO in a ratio of 4:1 (by volume) to prepare a lead-rich $(FAPbI_3)_{0.85}(MAPbBr_3)_{0.15}$ precursor solution. A 1.15M of $CsPbI_3$ precursor solution (in a mixed solvent of DMF and DMSO in equal volume was prepared. The $(FAPbI_3)_{0.85}(MAPbBr_3)_{0.15}$ precursor solution and the $CsPbI_3$ precursor solution were mixed in a ratio of 10 vol. %. The mixed solution was spin-coated in a nitrogen glove box at 1000 rpm for 10 seconds and then 4,000 rpm for 30 seconds. In this second stage, 100 µl of anhydrous trifluorotoluene was poured 15 seconds before completion of the spin coating. The resulting film was thermally treated at 100° C. for 60 minutes to thereby form a three-dimensional perovskite (referred to also as "3D"). Then, a 70-mM spiro-MeOTAD solution was spin-coated at 4000 rpm for 20 seconds. The 70-mM spiro-MeOTAD solution was prepared by dissolving, in chlorobenzene, 4-tert-butylpyridine (TBP), Li-TFSI dissolved in acetonitrile, and $Co[t-BuPyPz]_3$ $[TFSI]_3$ (FK209) dissolved in acetonitrile, to be in a molar ratio of Spiro:FK209:Li-TFSI:TBP of 1:0.03:0.5:3.3. Next, a gold electrode having a thickness of 70 nm was formed thereon by thermal deposition.

Evaluation Example 1

X-Ray Diffractometry (XRD)

Figure 4:
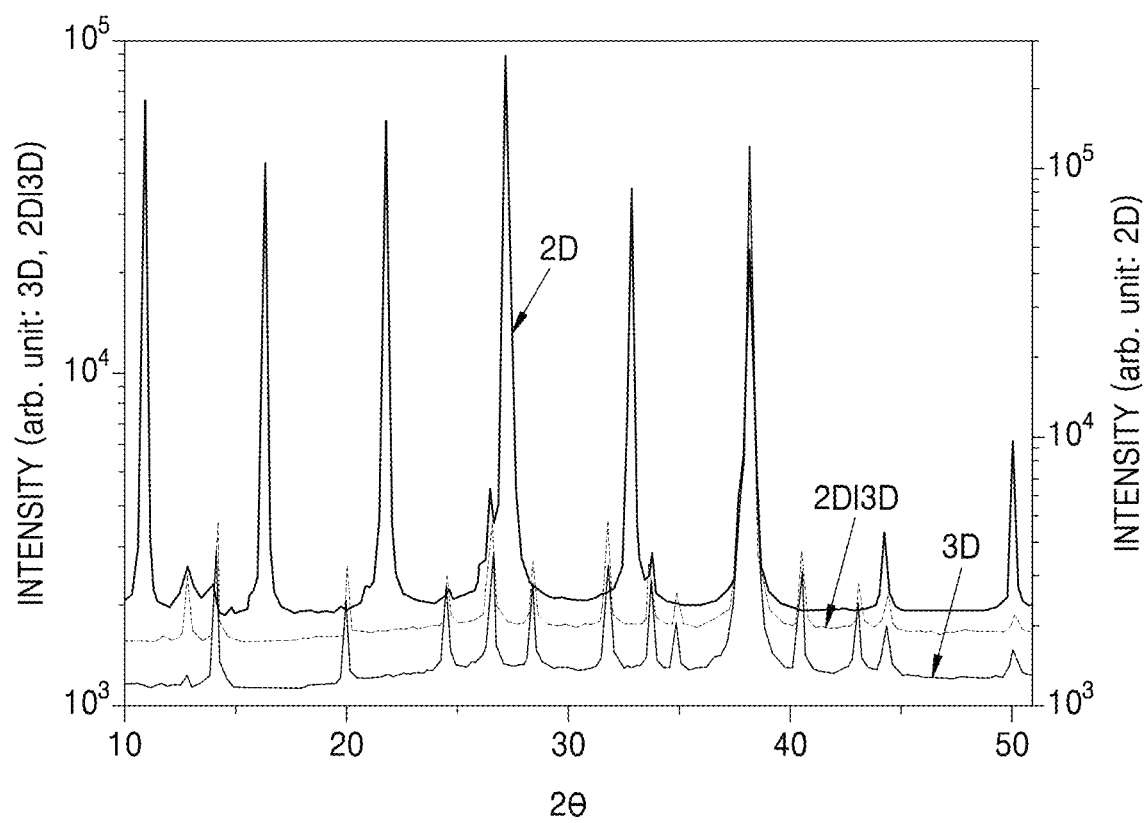
FIG. 4 is a graph of intensity (arbitrary units) versus diffraction angle (°2Θ) and illustrates the results of X-ray diffractometry (XRD) of Example (2DI3D), Comparative Example 1, and Comparative Example 2.

Example (2DI3D), Comparative Example 1 (2D), and Comparative Example 2 (3D) were analyzed by X-ray diffractometry. The XRD analysis results are shown in FIG. 4.

Example (2DI3D) was found to have the characteristics of both Comparative Example 1 and Comparative Example 2. In particular, the 2D perovskite was found to have higher crystallinity than the 3D perovskite.

Evaluation Example 2

Figure 5:
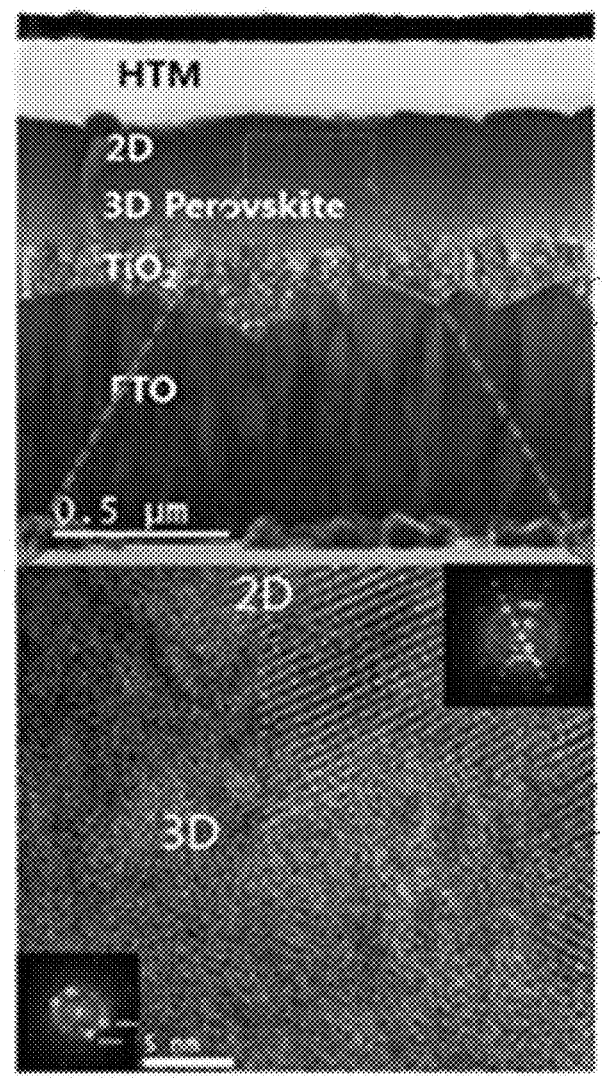
FIG. 5 illustrates images as results of transmission electron microscopy (TEM, (a) in FIG. 5) and selected area electron diffraction (SAED analysis (b) in FIG. 5)

Transmission Electron Microscope (TEM) and Selected Area Electron Diffraction (SAED) Patterns Referring to FIG. 5, it was found that the 2D perovskite of Example (2DI3D) had high crystallinity.

Evaluation Example 3

High-Energy Resolution Reflective Electron Energy Loss Spectroscopy (HR-REELS)

Figure 6:
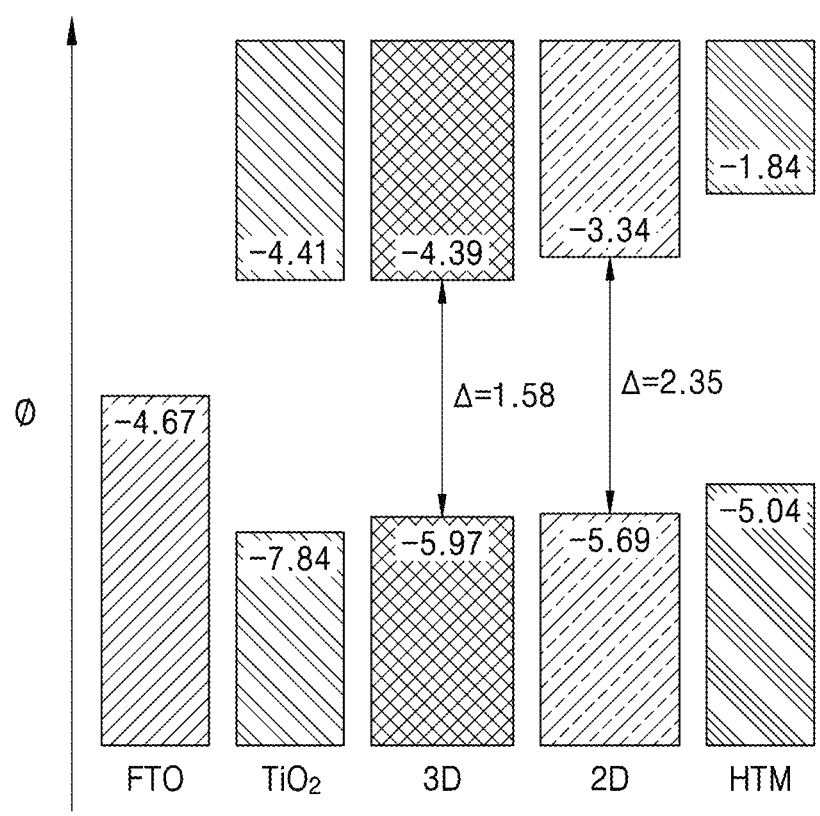
FIG. 6 illustrates energy bands of Example (2DI3D), obtained through high-energy resolution reflective electron loss spectroscopy (HR-REELS)

An energy band of Example (2DI3D) obtained through high-energy resolution reflective electron loss spectroscopy (HR-REELS) is shown in FIG. 6.

Evaluation Example 4

Photoluminescence (PL) Characteristics Measurement

Figure 7A:
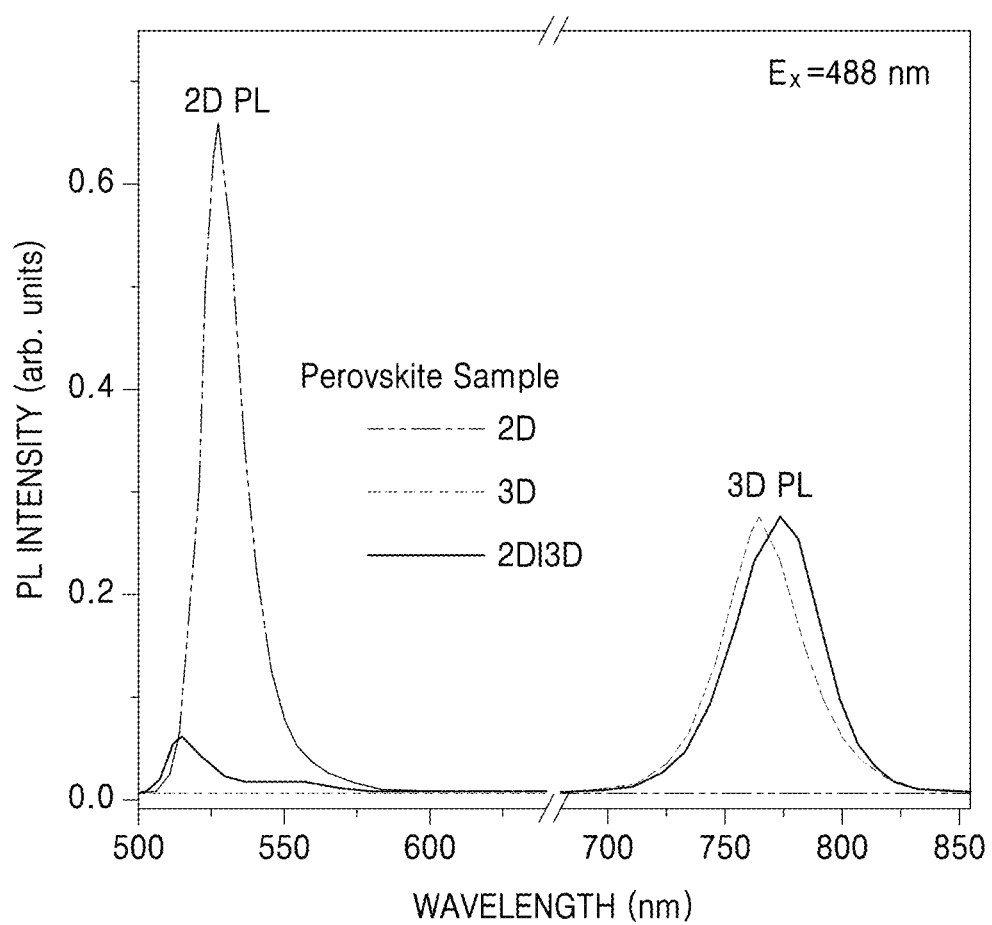
FIG. 7A is a graph of intensity (arbitrary units) versus wavelength (nm) and shows the photoluminescence (PL) spectra of Example (2DI3D), Comparative Example 1, and Comparative Example 2.

Photoluminescence (PL) spectra of Example (2DI3D), Comparative Example 1 and Comparative Example 2 excited with a laser beam at 488 nm were measured. The results are shown in FIG. 7A.

The PL peak of Comparative Example 1 (2DP) and the PL peak of Comparative Example 2 (3DP) were found at 527 nm and 773 nm, respectively. The PL peak of the Example (2DI3D) was found to be slightly shifted with respect to 2DP and 3DP. Although not limited by a specific theory, the results are attributed to a radiative recombination phenomenon caused by exchange/transfer of carriers at the 2DI3D interface.

Figure 7B:
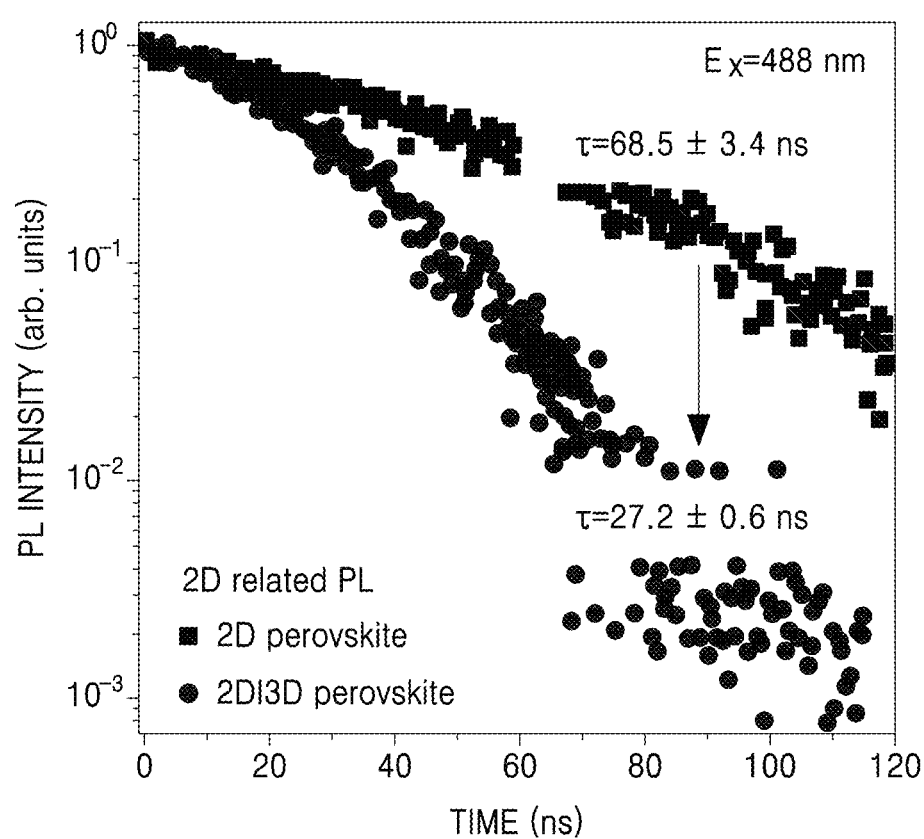
FIGS. 7B and 7C are each a graph of intensity (arbitrary units) versus time (ns) illustrating PL attenuation for Example (2DI3D), Comparative Example 1, and Comparative Example 2.

The PL attenuation curves with respect to time for 2DP in Example (2DI3D) and Comparative Example 1 excited with laser at 488 nm are shown in FIG. 7B. The PL attenuation curves with respect to time for 3DP in the Example (2DI3D) and Comparative Example 2 excited with laser at 488 nm are shown in FIG. 7C.

Figure 7C:
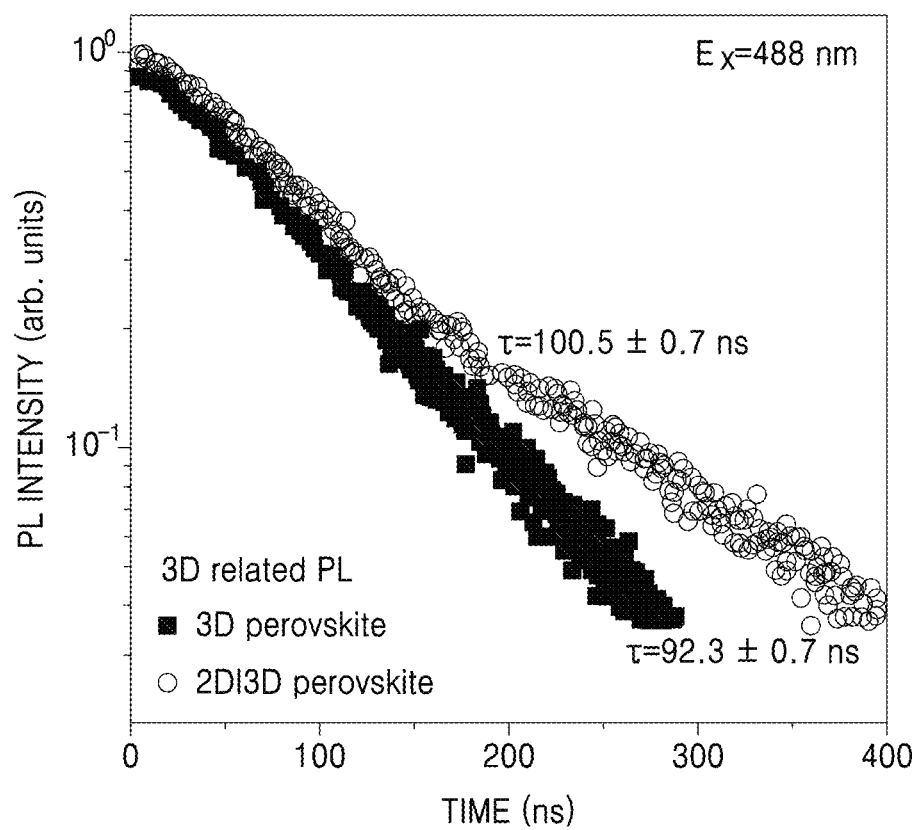

Referring to FIGS. 7B and 7C, it was found that PL lifetime of 2DP in Example (2DI3D) was reduced while PL lifetime of 3DP in Example (2DI3D) was increased. This supports the transfer of carriers from 2D to 3D at the 2D/3D interface.

Figure 8:
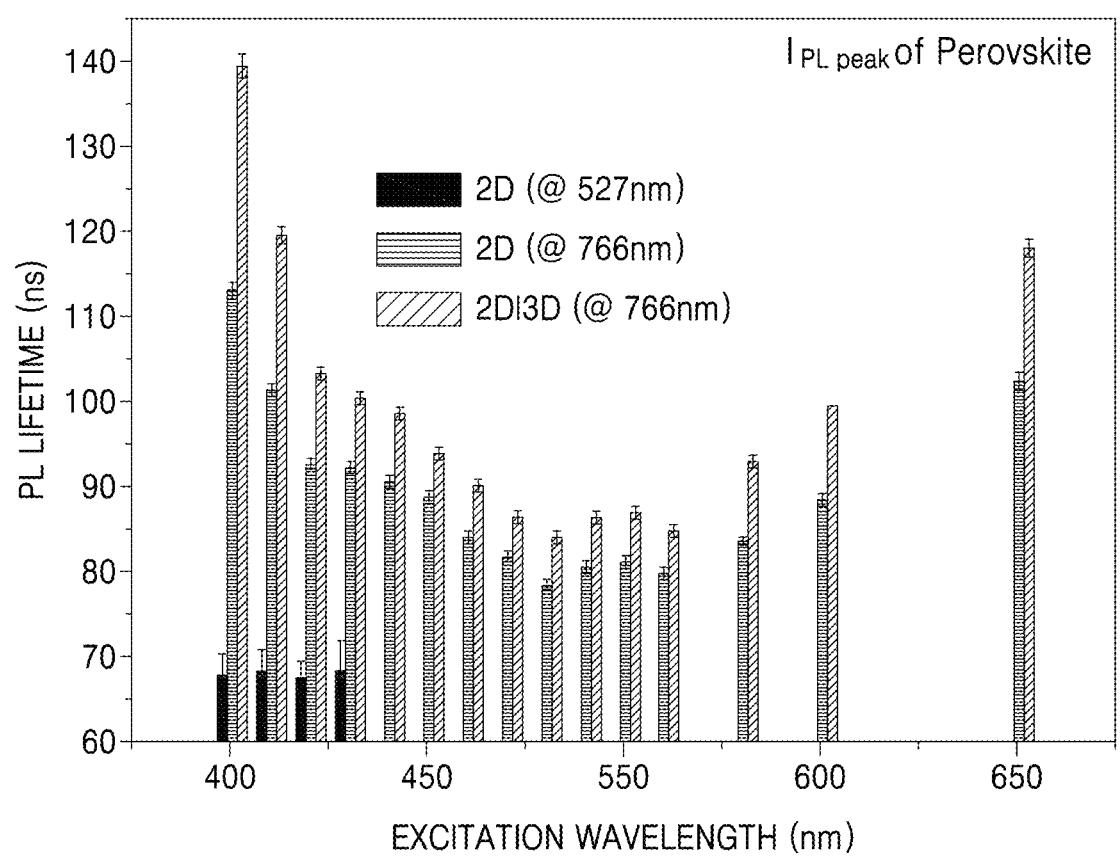
FIG. 8 is a graph illustrating PL attenuation (ns) with respect to different excitation wavelengths (nm)

FIG. 8 is a graph illustrating PL attenuation with respect to different excitation wavelengths.

Figure 9:
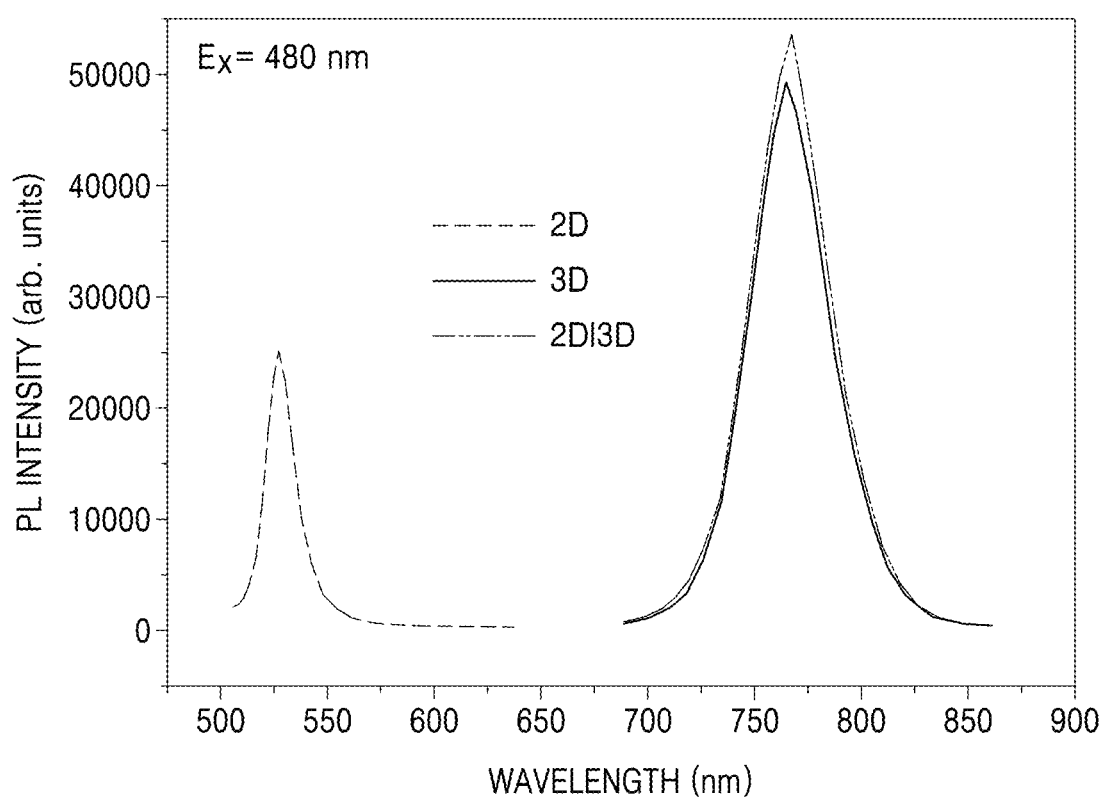
FIG. 9 is a graph of intensity (arbitrary units) versus wavelength (nm) and illustrates changes in a PL spectrum with respect to excitation energy.

FIG. 9 is a graph illustrating change in PL spectrum with respect to excitation energy Evaluation Example 5

Current Density-Voltage (J-V) Characteristics

Figure 10A:
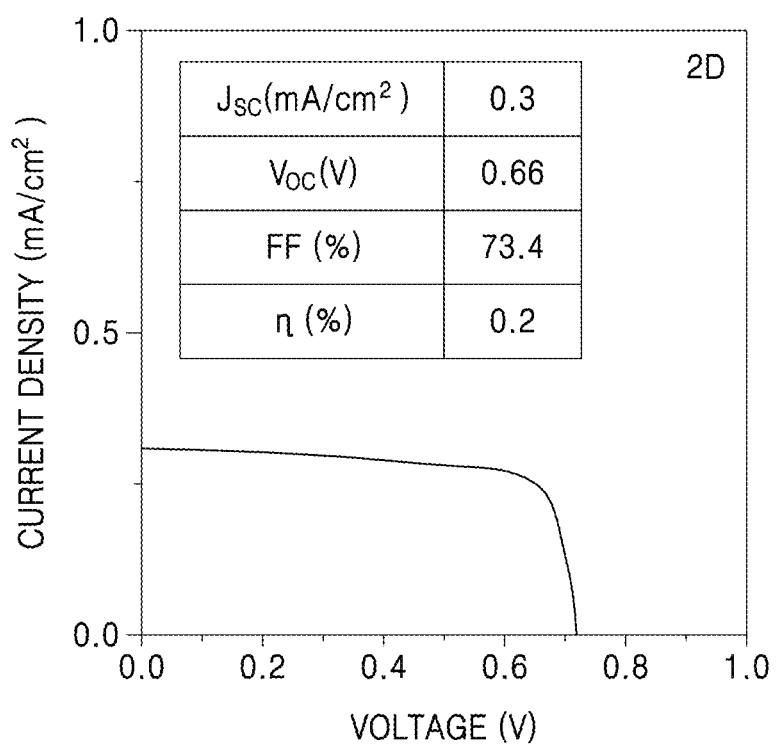
FIGS. 10A to 10C are graphs illustrating current density (milliamperes per square centimeter ($mA/cm^2$)) characteristics with respect to voltage (V) of Example (2DI3D), Comparative Example 1, and Comparative Example 2, respectively.
Figure 10B:
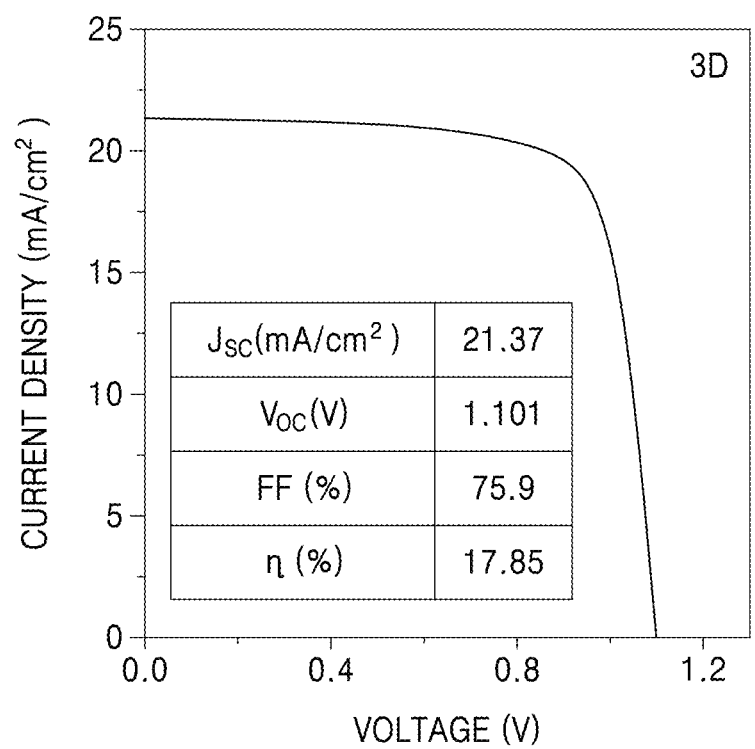
Figure 10C:
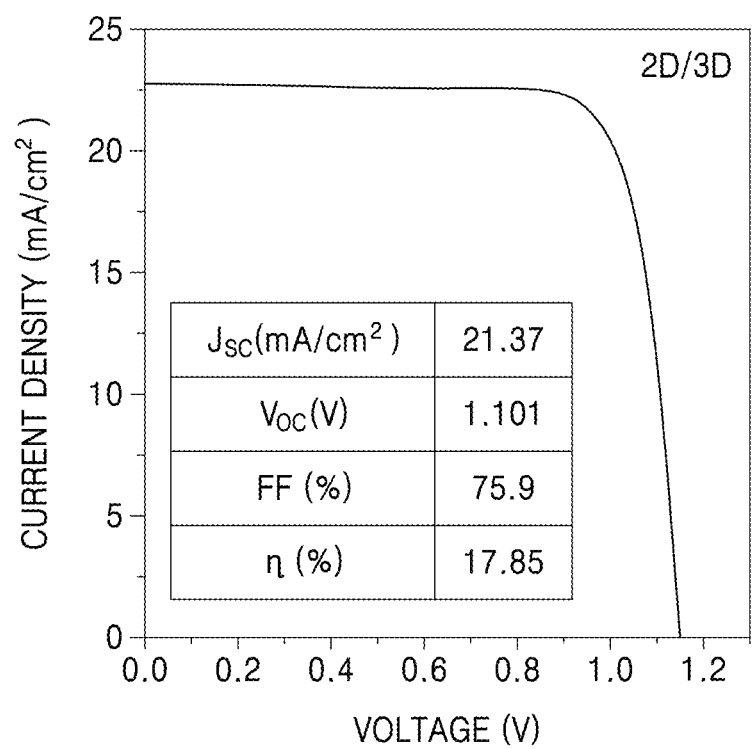

Current density characteristics with respect to voltage (J-V characteristics) of the diodes of Example (2DI3D), Comparative Example 1, and Comparative Example 2 are shown in FIGS. 10A to 10C, respectively. Solar cell parameters derived from the J-V characteristics, i.e., short current density (Jsc), open voltage (Voc), fill factor (FF), and power conversion efficiency (PCE:η) are also shown in FIGS. 10A to 10C.

Referring to FIGS. 10A to 10C, it was found that the PCE of the diode of Example (2DI3D) was improved over the PCEs of the diodes of Comparative Examples 1 and 2.

Evaluation Example 6

Current-Voltage (1-V) Characteristics

Figure 11:
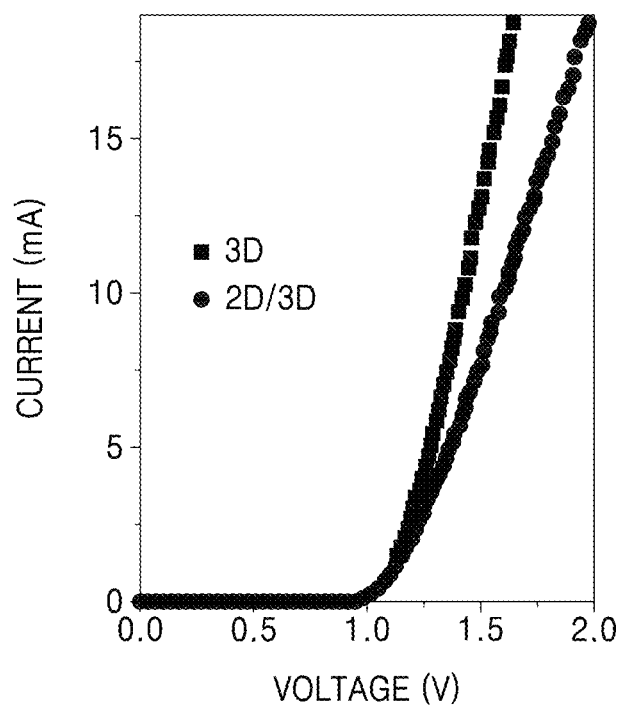
FIG. 11 is a graph illustrating dark current characteristics with respect to voltage (V) of Example (2DI3D) and Comparative Example 2.

FIG. 11 is a graph illustrating dark current characteristics with respect to voltage (I-V characteristics) of the diodes of Example (2DI3D) and Comparative Example 2.

Referring to FIG. 11, the diode of Example (2DI3D) was found to have a threshold voltage of about 0.9 V and an on/off ratio of about $4.8\times10^3$, both lower than those of the diode of Comparative Example 2.

Evaluation Example 7

Electroluminescence (EL) and External Quantum Efficiency (EQE) Measurement

As a result of measuring electroluminescence (EL) spectra with respect to various injection currents from 0.1 mA to 10 mA on the diode of the Example (2DI3D) by contacting a metal tip on the electrode, without connection with a lead wire, as demonstrated from the PL characteristics, the EL peak of the Example (2DI3D) was found to nearly match with the 3DP PL that appears due to the transfer of carriers from 2D to 3D at the 2D/3D interface, and it was confirmed that the EL peak of the Example (2DI3D) was located exactly at 3DP, regardless of injection currents.

Figure 12:
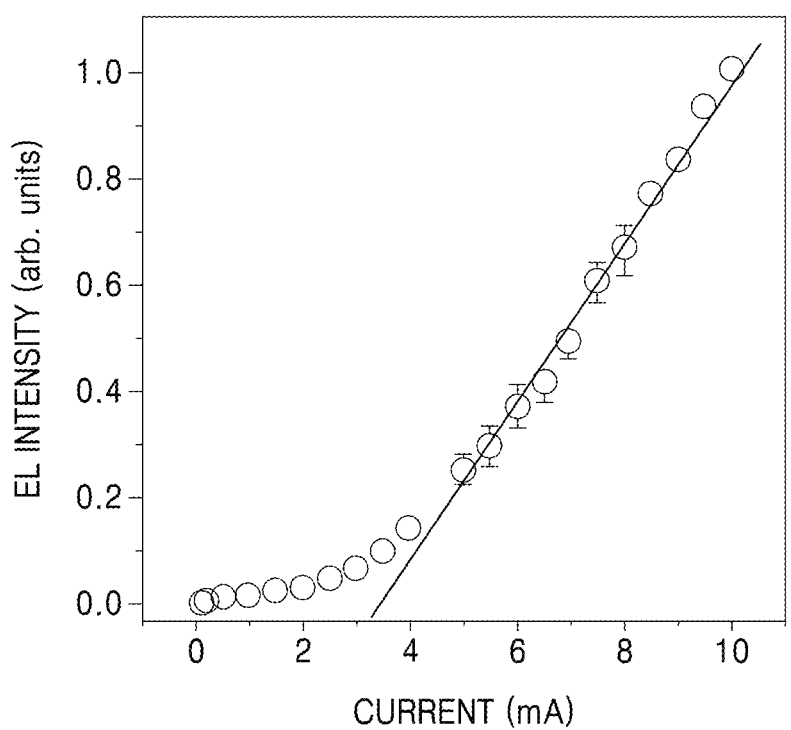
FIG. 12 is a graph of intensity (arbitrary units) versus current (mA) and of electroluminescence (EL) peak intensity of Example (2DI3D)

FIG. 12 is a graph illustrating EL peak intensity with respect to injection current of the diode of Example (2DI3D).

Referring to FIG. 12, it was found that the EL peak intensities were nearly proportional to the injection current up to 10 mA.

Figure 13:
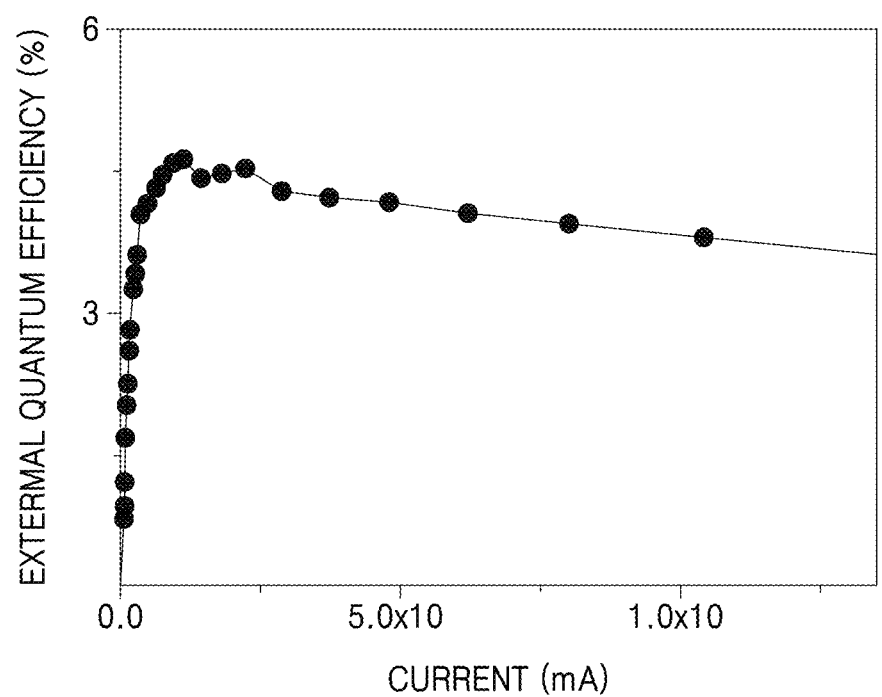
FIG. 13 is a graph illustrating external quantum efficiency (%) versus current (mA) of Example (2DI3D)

FIG. 13 is a graph illustrating external quantum efficiency (EQE) of the diode of Example (2DI3D).

Referring to FIG. 13, the peak EQE of the diode of Example (2DI3D) was found to be about 4.6%.

For reference, EL measurement was not carried out on the diodes of Comparative Example 1 and Comparative Example 2.

Evaluation Example 8

Deep-Level Transient Spectroscopy (DLTS) and Carrier Density Analysis

Figure 14A:
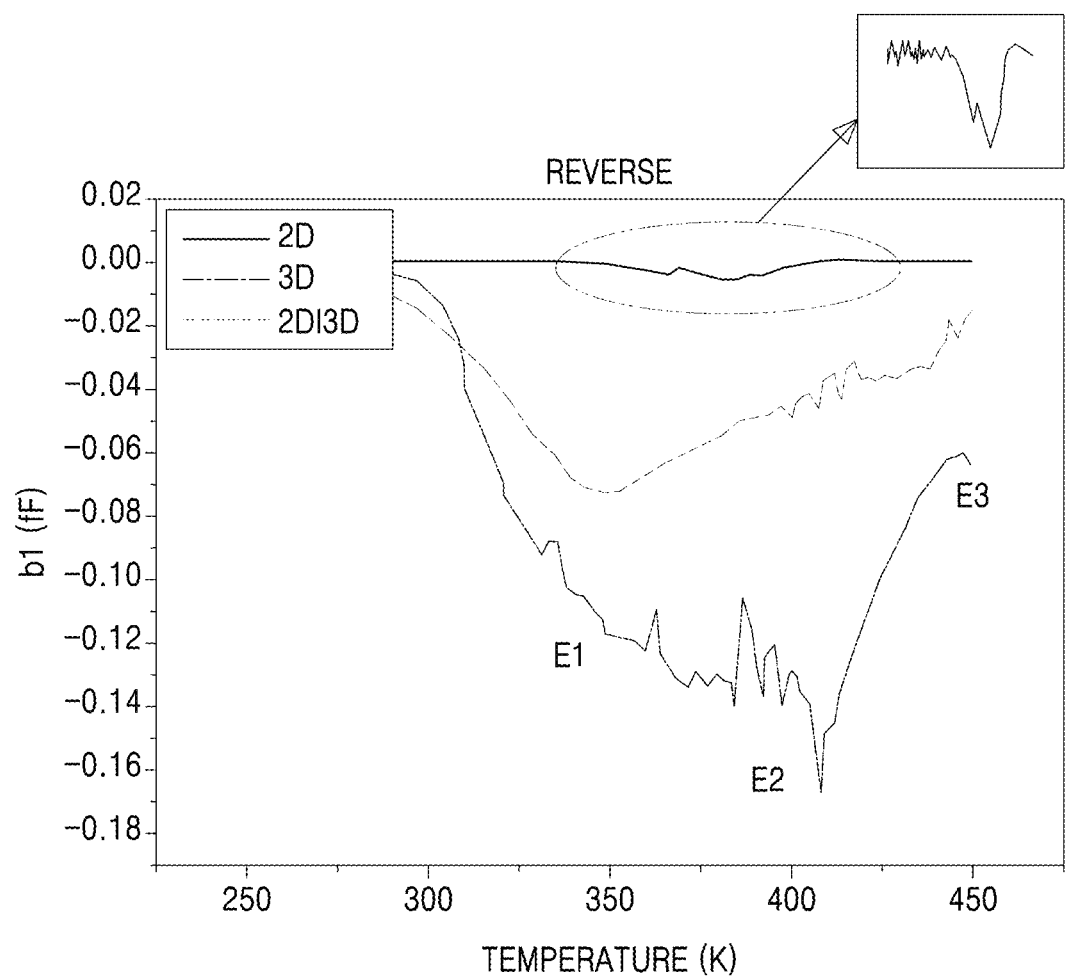
FIGS. 14A and 14B illustrate the deep-level transient spectroscopy (DLTS) spectra of Example (2DI3D), Comparative Example 1, and Comparative Example 2.
Figure 14B:
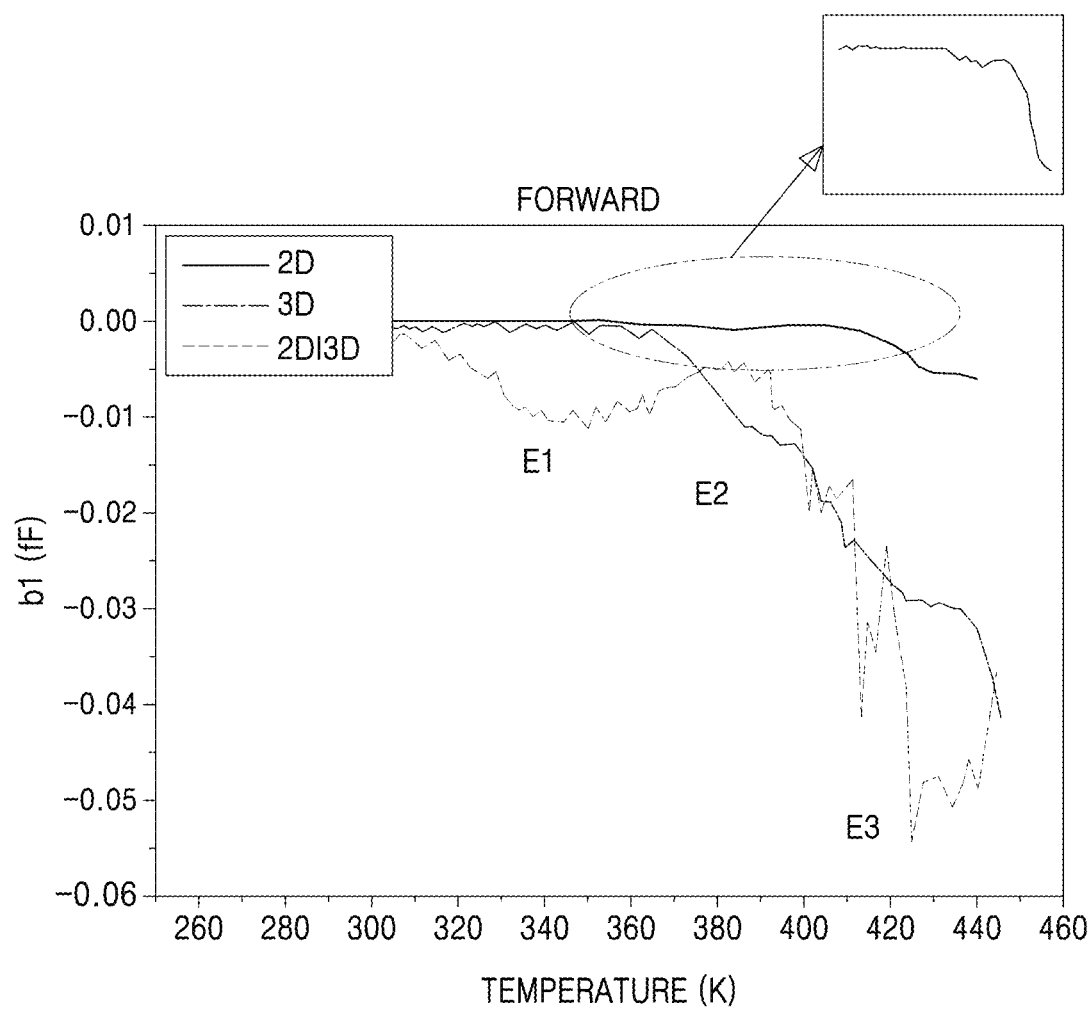

Deep-level transient spectroscopy (DLTS) spectra of Example (2DI3D), Comparative Example 1, and Comparative Example 2 are shown in FIGS. 14A and 14B. In particular, FIGS. 14A and 14B are the reverse and forward spectra thereof, respectively.

Figure 15A:
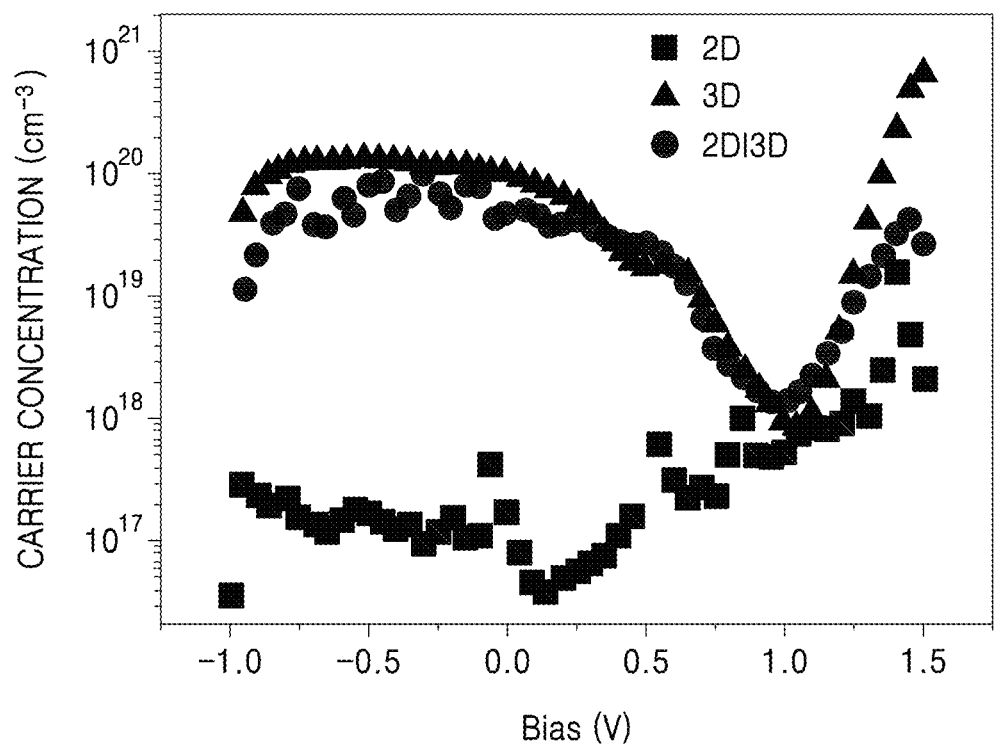
FIG. 15A is a graph of carrier concentration ($cm^{\times 3}$) with respect to bias (V) of Example (2DI3D), Comparative Example 1, and Comparative Example 2.

FIG. 15A is a graph of carrier concentration with respect to bias of Example (2DI3D), Comparative Example 1, and Comparative Example 2.

Figure 15B:
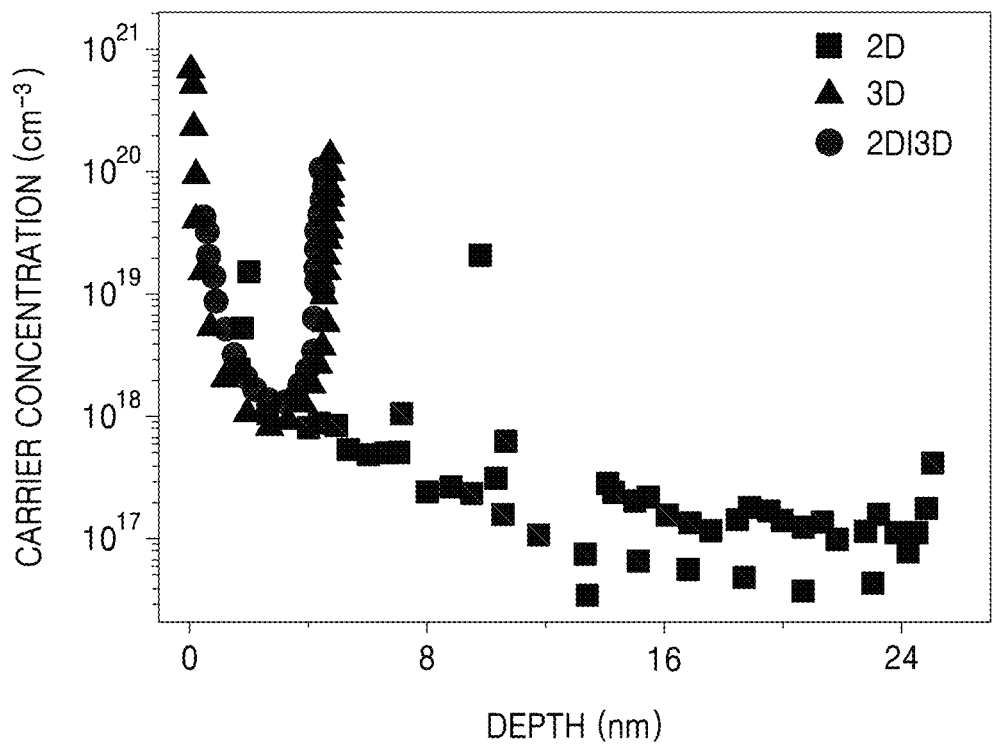
FIG. 15B is a graph of carrier concentration (cm$^{-3}$) with respect to depth (nm) of Example (2DI3D), Comparative Example 1, and Comparative Example 2.

FIG. 15B is a graph of carrier concentration with respect to depth of Example (2DI3D), Comparative Example 1, and Comparative Example 2.

Figure 16:
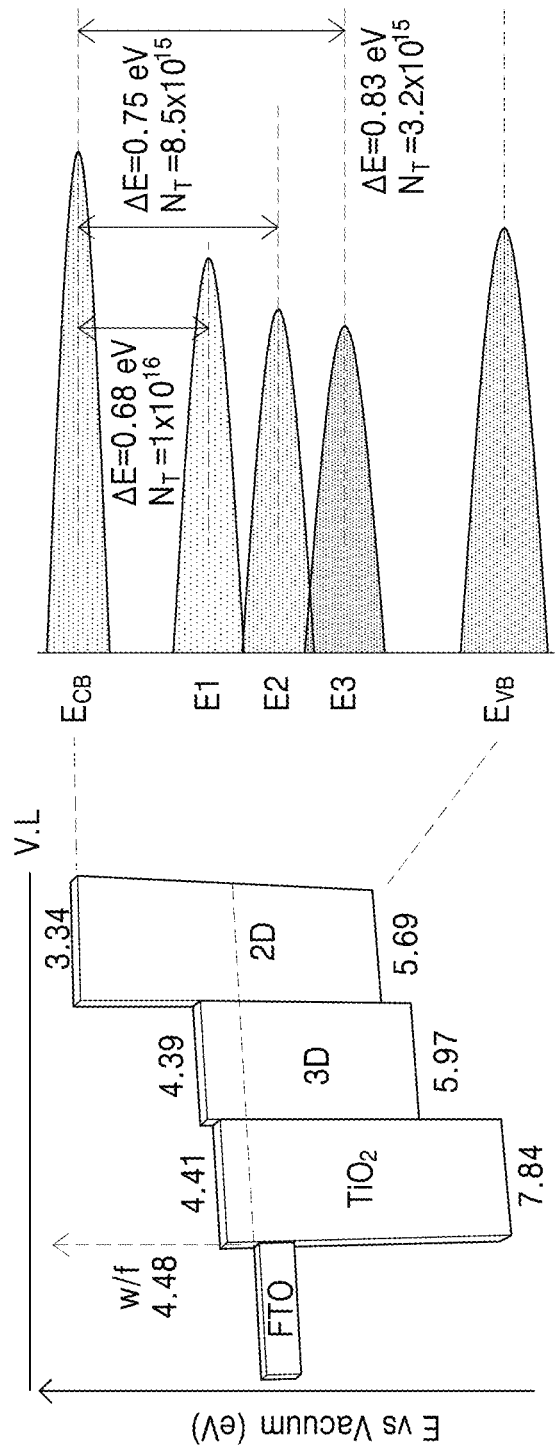
FIG. 16 illustrates the energy states of Example (2DI3D), Comparative Example 1, and Comparative Example 2.

FIG. 16 illustrates the energy states of Example (2DI3D), Comparative Example 1, and Comparative Example 2.

Referring to FIGS. 14A and 14B, three major defect states of 350K (E1), 410K (E2), and 440K (E3) were found. E1, E2, and E3 are due to the intrinsic defects of $I_{pb}$, $I_{MA}$, and bromine atoms, respectively.

In particular, compared to the change in the DLTS spectra of the diode of Comparative Example 2 was very large, the change in the DLTS spectra of the diode of Comparative Example 1 was small.

Specific defect parameters such as activation energy, defect density, and cross-section were calculated from the DLTS spectra. The results are shown in Table 1.

TABLE 1

|  |  | Comparative Example 1 | | | Comparative Example 2 | | | Example (2DI3D) | | |
| --- | --- | --- | --- | --- | --- | --- | --- | --- | --- | --- |
|  |  | E1 | E2 | E3 | E1 | E2 | E3 | E1 | E2 | E3 |
| Forward region | Et (eV) |  | 0.72 | 0.8 |  | 0.76 | 0.83 | 0.65 | 0.75 | 0.81 |
|  | Nt (cm$^{-3}$) |  | $2.7 \times 10^{13}$ | $9.6 \times 10^{13}$ |  | $5.2 \times 10^{15}$ | $6.2 \times 10^{15}$ | $1.2 \times 10^{15}$ | $3 \times 10^{15}$ | $8.5 \times 10^{15}$ |
|  | Cross-section ($\sigma$, cm$^2$) |  | $7 \times 10^{-16}$ | $5 \times 10^{-16}$ |  | $1.1 \times 10^{-15}$ | $0.5 \times 10^{-15}$ | $2 \times 10^{-15}$ | $1 \times 10^{-15}$ | $6 \times 10^{-16}$ |
| Reverse region | Et (eV) | 0.65 | 0.73 | 0.79 | 0.66 | 0.76 | 0.83 | 0.65 | 0.75 | 0.83 |
|  | Nt (cm$^{-3}$) | $1.1 \times 10^{13}$ | $1.3 \times 10^{13}$ | $8.1 \times 10^{11}$ | $3.1 \times 10^{16}$ | $5.2 \times 10^{16}$ | $1.2 \times 10^{16}$ | $1.0 \times 10^{16}$ | $8.5 \times 10^{15}$ | $3.2 \times 10^{15}$ |
|  | Cross-section ($\sigma$, cm$^2$) | $3 \times 10^{-16}$ | $7 \times 10^{-16}$ | $5 \times 10^{-16}$ | $4.1 \times 10^{-15}$ | $1.1 \times 10^{-15}$ | $0.5 \times 10^{-15}$ | $2 \times 10^{-15}$ | $1 \times 10^{-15}$ | $6 \times 10^{-16}$ |

Referring to Table 1, it was found that the diodes of Comparative Example 1, Comparative Example 2, and Example (2DI3D) had a defect density of $10^{-16}$cm$^{-3}$, $10^{-15}$ cm$^{-3}$, and $10^{-15}$ cm$^{-3}$, respectively.

Referring to FIG. 15A, it was found that the diodes of Comparative Example 1, Comparative Example 2, and Example (2DI3D) had a defect density of $10^{-16}$cm$^{-3}$, $10^{-15}$ cm$^{-3}$, and $10^{-15}$ cm$^{-3}$, respectively.

The diode of Comparative Example 1 had a very low PCE due to a very low carrier concentration, despite the smallest defect density. The diode of Comparative Example 2 exhibited a higher PCE due to a higher carrier concentration as compared with the diode of Comparative Example 1, despite the higher defect density.

On the other hand, the diode of Example (2DI3D) had the highest carrier concentration due to the transfer of carries from 2D to 3D, and thus the highest PCE, leading to electroluminescence (EL).

As described herein, an optoelectronic apparatus is capable of both receiving and emitting light on a chip, thus reducing the manufacturing cost and increasing both light-receiving efficiency and light-transmitting efficiency, and thus is applicable for various purposes.

It should be understood that embodiments described herein should be considered in a descriptive sense only and not for purposes of limitation. Descriptions of features, aspects, or advantages within each embodiment should be considered as available for other similar features, aspects, or advantages in other embodiments. While one or more embodiments have been described with reference to the figures, it will be understood by those of ordinary skill in the art that various changes in form and details may be made therein without departing from the spirit and scope as defined by the following claims.

What is claimed is:

1. An optoelectronic apparatus comprising:
   an optoelectronic diode comprising a first electrode, a second electrode, and a photoelectric conversion layer interposed between the first electrode and the second electrode;
   a first driving part; and
   a second driving part,
   wherein each of the first driving part and the second driving part is electrically connected to the optoelectronic diode,
   the optoelectronic diode is driven by the first driving part in a light-receiving mode,
   the optoelectronic diode is driven by the second driving part in a light-emitting mode, and
   wherein the photoelectric conversion layer comprises a first layer including a three-dimensional perovskite and a second layer including a two-dimensional perovskite.

2. The optoelectronic apparatus of claim 1, wherein
   the first driving part collects power generated between the first electrode and the second electrode, and
   the second driving part applies power between the first electrode and the second electrode.

3. The optoelectronic apparatus of claim 2, wherein light is emitted at an interface between the first layer including the three-dimensional perovskite and the second layer including the two-dimensional perovskite in the light-emitting mode.

4. The optoelectronic apparatus of claim 1, wherein the first driving part and the second driving part are electrically connected to allow power collected by the first driving part to be supplied to the second driving part.

5. The optoelectronic apparatus of claim 1, further comprising a sensor part,
   wherein the sensor part senses external light to determine whether the optoelectronic diode operates in the light-receiving mode or the light-emitting mode.

6. The optoelectronic apparatus of claim 1, wherein the first layer including the three-dimensional perovskite and the second layer including the two-dimensional perovskite directly contact each other.

7. The optoelectronic apparatus of claim 1, wherein a band gap of the two-dimensional perovskite is different from a band gap of the three-dimensional perovskite.

8. The optoelectronic apparatus of claim 1, wherein a band gap of the two-dimensional perovskite is greater than a band gap of the three-dimensional perovskite.

9. The optoelectronic apparatus of claim 1, wherein a difference between a band gap of the two-dimensional perovskite and a band gap of the three-dimensional perovskite is about 0.01 electron volts to about 1.0 electron volts.

10. The optoelectronic apparatus of claim 1, wherein
    the three-dimensional perovskite is represented by Formula 1, and
    the two-dimensional perovskite is represented by Formula 2:

$$[A^1][B^1][X^1]_3 \quad \text{Formula 1}$$

$$[A^2]_2[A^3]_{n-1}[B^2]_n[X^2]_{3n+1} \quad \text{Formula 2}$$

wherein, in Formula 1,
    $A^1$ is $R_{11}R_{12}R_{13}C$, $R_{14}R_{15}R_{16}R_{17}N$, $R_{18}R_{19}N{=}C(R_{20}){-}NR_{21}R_{22}$, Li, Na, K, Rb, Cs, Fr, or a combination thereof,
    $A^2$ and $A^3$ are each independently $R_{31}R_{32}R_{33}C$, $R_{34}R_{35}R_{36}R_{37}N$, $R_{38}R_{39}N{=}C(R_{40}){-}NR_{41}R_{42}$, Li, Na, K, Rb, Cs, Fr, or a combination thereof,
    wherein $R_{11}$ to $R_{22}$ are each independently hydrogen, deuterium, $-N(Q_{11})(Q_{12})$, a $C_1$-$C_3$ alkyl group, a $C_2$-$C_3$ alkenyl group, a $C_2$-$C_3$ alkynyl group, or a $C_1$-$C_3$ alkoxy group,
    wherein $Q_{11}$ and $Q_{12}$ are each independently hydrogen, deuterium, a $C_1$-$C_3$ alkyl group, a $C_2$-$C_3$ alkenyl group, a $C_2$-$C_3$ alkynyl group, a $C_1$-$C_3$ alkoxy group, or a combination thereof;
    wherein $R_{31}$ to $R_{42}$ are each independently hydrogen, deuterium, $-N(Q_{21})(Q_{22})$, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{20}$ aryl group, a substituted or unsubstituted $C_7$-$C_{20}$ aralkyl group, or a combination thereof,
    wherein at least one of $R_{31}$ to $R_{33}$, at least one of $R_{34}$ to $R_{37}$, and at least one of $R_{38}$ to $R_{42}$ are each independently a substituted or unsubstituted $C_4$-$C_{10}$ alkyl group, a substituted or unsubstituted $C_4$-$C_{10}$ alkenyl group, a substituted or unsubstituted $C_4$-$C_{10}$ alkynyl group, a substituted or unsubstituted $C_4$-$C_{10}$ alkoxy group, a substituted or unsubstituted $C_6$-$C_{20}$ aryl group, a substituted or unsubstituted $C_7$-$C_{20}$ aralkyl group, or a combination thereof;
    wherein $Q_{21}$ and $Q_{22}$ are each independently hydrogen, deuterium, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted alkoxy group, a substituted or unsubstituted $C_6$-$C_{20}$ aryl group, a substituted or unsubstituted $C_7$-$C_{20}$ aralkyl group, or a combination thereof;
    $B^1$ and $B^2$ are each independently Pb, Sn, Bi, Sb, Cu, Ag, Au, La, Ce, Pr, Nd, Pm, Sm, Eu, Gd, Tb, Dy, Ho, Er, Tm, Yb, Lu, Be, Mg, Ca, Sr, Ba, Ra, or a combination thereof;
    $X^1$ and $X^2$ are each independently F, Cl, Br, I, or a combination thereof; and
    n is an integer of 1 or greater.

11. The optoelectronic apparatus of claim 10, wherein
    $A^1$ is $NH_4$, $CH_3NH_3$, $C_2H_5NH_3$, $(CH_3)_2NH_2$, $CH(NH_2)_2$, Li, Na, K, Rb, Cs, Fr, or a combination thereof;
    $A^2$ and $A^3$ are each independently anilinium, phenylmethyl ammonium, phenylethyl ammonium, a $C_4$-$C_{10}$ alkyl ammonium, or a combination thereof;
    $B^1$ and $B^2$ are each independently Pb, Sn, Bi, Sb, Cu, Ag, Au, or a combination thereof; and
    $X^1$ and $X^2$ are each independently Cl, Br, I, or a combination thereof.

12. The optoelectronic apparatus of claim 10, wherein
    $A^1$ is $CH_3NH_3$, $CH(NH_2)_2$, Cs, or a combination thereof;
    $A^2$ and $A^3$ are each independently phenylethyl ammonium;
    $B^1$ and $B^2$ are each independently Pb;
    $X^1$ and $X^2$ are each independently Br, I, or a combination thereof; and
    n is 1.

13. The optoelectronic apparatus of claim 1, wherein
    the three-dimensional perovskite is represented by Formula 1-1, and
    the two-dimensional perovskite is represented by Formula 2-1:

$$[CH(NH_2)_2]_a[CH_3NH_3]_b[Cs]_cPb[Br]_d[I]_e \quad \text{Formula 1-1}$$

$$PEA_2PbI_4 \quad \text{Formula 2-1}$$

wherein, in Formulae 1-1 and 2-1,
- a, b, and c are each independently a real number greater than 0 to less than 1, and (a+b+c)=1;
- d and e are each independently a real number greater than 0 to less than 3, and (d+e)=3; and
- PEA is phenylethyl ammonium.

14. The optoelectronic apparatus of claim 1, wherein at least one of the first electrode or the second electrode has a transmittance of about 75% to 100% with respect to light having a wavelength ranging from 10 nanometers to 1 millimeter.

15. The optoelectronic apparatus of claim 1, further comprising:
- a first charge transport region between the first electrode and the photoelectric conversion layer; and/or
- a second charge transport region between the photoelectric conversion layer and the second electrode.

16. The optoelectronic apparatus of claim 15, wherein the first charge transport region comprises a metal oxide.

17. The optoelectronic apparatus of claim 15, wherein the first charge transport region comprises $TiO_2$, ZnO, $SrTiO_3$, $WO_3$, or a combination thereof.

18. The optoelectronic apparatus of claim 15, wherein the second charge transport region comprises a hole-transporting organic small molecule, a hole-transporting organic polymer compound, or a combination thereof.

19. The optoelectronic apparatus of claim 15, wherein the second charge transport region comprises 2,2,7,7'-tetrakis-(N,N-di-p-methoxyphenyl-amine)-9,9'-spirobifluoren, poly(3-hexylthiophene), 4-tert-butylpyridine, lithium bis(trifluoromethane)sulfonimidate, or a combination thereof.

20. A method of manufacturing an optoelectronic apparatus, the method comprising:
- providing an optoelectronic diode comprising a first electrode and a second electrode,
- disposing a three-dimensional perovskite solution onto the first electrode to form a first layer;
- disposing a two-dimensional perovskite solution onto the first layer to form a second layer; and
- providing a first driving part and a second driving part which are electrically connected to the optoelectronic diode,
- wherein the first layer and the second layer form a photoelectric conversion layer between the first electrode and the second electrode.

* * * * *